United States Patent
Park et al.

(10) Patent No.: US 10,222,269 B2
(45) Date of Patent: Mar. 5, 2019

(54) METHOD AND APPARATUS FOR OPERATING SENSOR OF ELECTRONIC DEVICE

(71) Applicant: Samsung Electronics Co., Ltd., Suwon-si, Gyeonggi-do (KR)

(72) Inventors: Mi-Ra Park, Daejeon (KR); Yong-Sang Yun, Suwon-si (KR); Myung-Hoon Kwak, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 266 days.

(21) Appl. No.: 15/079,737

(22) Filed: Mar. 24, 2016

(65) Prior Publication Data

US 2016/0299010 A1 Oct. 13, 2016

(30) Foreign Application Priority Data

Apr. 9, 2015 (KR) .................... 10-2015-0050474

(51) Int. Cl.
| | |
|---|---|
| *G06F 3/044* | (2006.01) |
| *G01K 1/00* | (2006.01) |
| *G06F 3/041* | (2006.01) |
| *G01D 5/24* | (2006.01) |
| *H04L 29/08* | (2006.01) |

(52) U.S. Cl.
CPC ............. *G01K 1/00* (2013.01); *G01D 5/24* (2013.01); *G06F 3/041* (2013.01); *G06F 3/044* (2013.01); *G06F 3/0418* (2013.01); *H04L 67/10* (2013.01); *G06F 2203/04106* (2013.01); *H03K 2217/94026* (2013.01)

(58) Field of Classification Search
CPC .. G01K 1/00; H04L 67/10; G01D 5/24; G06F 3/041; G06F 3/044; G06F 3/0418; G06F 2203/04106; H03K 2217/94026; B65H 2701/31; B65H 54/26; B65H 63/062; B65H 2557/65; D01H 13/32
See application file for complete search history.

(56) References Cited

U.S. PATENT DOCUMENTS 6,911,628 B1 * 6/2005 Hirayama ................ G05B 5/01
219/483
9,513,018 B2 * 12/2016 Kim ....................... F24D 12/02
(Continued)

FOREIGN PATENT DOCUMENTS

| | | |
|---|---|---|
| EP | 2 413 224 A2 | 2/2012 |
| KR | 10-2007-0073680 A | 7/2007 |

(Continued)

*Primary Examiner* — Harry W Byrne
*Assistant Examiner* — Sultana Begum
(74) *Attorney, Agent, or Firm* — Jefferson IP Law, LLP

(57) ABSTRACT

An electronic device and method are provided for sensing a touch or hovering event, where sensor variations due to environmental temperatures are minimized. The method includes operations for measuring a temperature of a portion of an electronic device, setting a sensing state reference level of a grip sensor according to the measured temperature, and determining a sensing state of an external object for the electronic device according to a result of a comparison between an output level from the grip sensor and the sensing state reference level of the grip sensor.

10 Claims, 16 Drawing Sheets

(56) References Cited

U.S. PATENT DOCUMENTS

| | | | |
|---|---|---|---|
| 2007/0027580 A1* | 2/2007 | Ligtenberg | G05D 23/19 700/300 |
| 2008/0047764 A1 | 2/2008 | Lee et al. | |
| 2009/0067826 A1* | 3/2009 | Shinohara | G03B 17/18 396/50 |
| 2009/0260898 A1 | 10/2009 | Jin et al. | |
| 2012/0026123 A1 | 2/2012 | Grunthaner et al. | |
| 2012/0050180 A1 | 3/2012 | King et al. | |
| 2013/0050139 A1 | 2/2013 | Gute | |
| 2013/0193985 A1 | 8/2013 | Tillotson | |
| 2014/0066124 A1 | 3/2014 | Novet | |
| 2014/0163765 A1* | 6/2014 | Jain | G06F 1/206 700/300 |
| 2014/0362889 A1 | 12/2014 | Jang et al. | |

FOREIGN PATENT DOCUMENTS

| | | |
|---|---|---|
| KR | 10-2009-0111429 A | 10/2009 |
| KR | 10-2011-0002189 A | 1/2011 |
| KR | 10-2012-0012446 A | 2/2012 |
| KR | 10-2014-0144423 A | 12/2014 |
| KR | 10-2015-0019352 A | 2/2015 |

\* cited by examiner

METHOD AND APPARATUS FOR OPERATING SENSOR OF ELECTRONIC DEVICE

CROSS-REFERENCE TO RELATED APPLICATION(S)

This application claims the benefit under 35 U.S.C. § 119(a) of a Korean patent application filed in the Korean Intellectual Property Office on Apr. 9, 2015 and assigned Serial No. 10-2015-0050474, the entire disclosure of which is incorporated herein by reference.

TECHNICAL FIELD

Embodiments of the present disclosure relate to methods and apparatuses for operating sensors in electronic devices.

DISCUSSION OF RELATED ART

An electronic device includes sensors, such as (infrared (IR) or capacitive) proximity sensors, to determine whether a user approaches. Proximity sensing is the technique of sensing approach of an external object to toward an electronic device. The electronic device may recognize a sensed proximity state as an input and use the same to change user interfaces (UIs) of the electronic device, run a particular function, or transfer particular information to the user.

Currently, a portable electronic device has been provided that may transmit electromagnetic waves for data communication using radio communication techniques such as global system for mobile communication (GSM), general packet radio service (GPRS), or enhanced data rates for GSM evolution (EDGE). However, some electromagnetic waves radiated from the electronic device may harm the human body, and various domestic and foreign organizations attempt to restrict these harmful electromagnetic waves. For example, the specific absorption rate (SAR) is a value indicating how much electromagnetic radiation from an electronic device is absorbed by the human body. The SAR is denoted in units of W/g, the amount of power (W) absorbed per 1 g of the human body. As the issue of harmfulness of electromagnetic waves attracts wider attention, SAR restriction standards for electronic devices have been established.

Further, an electronic device has been provided with a proximity sensor such as a grip sensor, and reduces the SAR in such a manner as to reduce the output of signals radiated as the proximity sensor operates. However, the proximity sensor may malfunction depending on environmental temperature, and may occasionally cause erroneous signal outputs. As the proximity sensor causes malfunctions depending on environmental temperatures, malfunctions may also ensue when changing UIs, running a particular function, or transferring particular information to the user through the proximity sensor.

The above information is presented as background information only, and to assist with an understanding of the present disclosure. No determination has been made, and no assertion is made, as to whether any of the above might be applicable as prior art with regard to the present disclosure.

SUMMARY

Aspects of the present disclosure are provided to address at least the above-mentioned problems and/or disadvantages, and to provide at least the advantages described below. Accordingly, an aspect of the present disclosure is to provide a method and apparatus for operating a sensor of an electronic device which may prevent malfunctions of the sensor depending on temperatures to allow the sensor to stably determine a sensing state.

In accordance with an aspect of the present disclosure, a method for operating an electronic device is provided. The method includes measuring a temperature of a portion of the electronic device, setting a sensing state reference level of a sensor according to the measured temperature, and determining a sensing state of an external object for the electronic device according to a result of a comparison between an output level from the sensor and the sensing state reference level of the sensor.

In accordance with another aspect of the present disclosure, a method for operating an electronic device is provided. The method includes measuring a temperature of a portion of the electronic device, correcting a sensing level applied to a sensor according to the measured temperature, and determining a sensing state of an external object for the electronic device according to a result of a comparison between an output level from the sensor at the corrected sensing level and a preset sensing state reference level of the sensor.

In accordance with another aspect of the present disclosure, an electronic device is provided. The electronic device includes a conductive pattern, a first sensor for sensing a capacitive component of the conductive pattern, a second sensor for measuring a temperature of a portion of the electronic device, and a controller for receiving temperature information from the second sensor or temperature information based on a position of the electronic device to set a sensing state reference level of the first sensor, and determining a sensing state of an external object for the electronic device according to a result of a comparison between an output level from the first sensor and the sensing state reference level of the sensor.

In accordance with another aspect of the present disclosure, an electronic device is provided. The electronic device includes a conductive pattern, a first sensor for sensing a capacitive component of the conductive pattern, a second sensor for measuring a temperature of a portion of the electronic device, and a controller receiving temperature information from the second sensor or temperature information based on a position of the electronic device to correct a sensing level applied to the first sensor, and determining a sensing state of an external object for the electronic device according to a result of a comparison between an output level from the first sensor at the corrected sensing level and a preset sensing state reference level of the first sensor.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
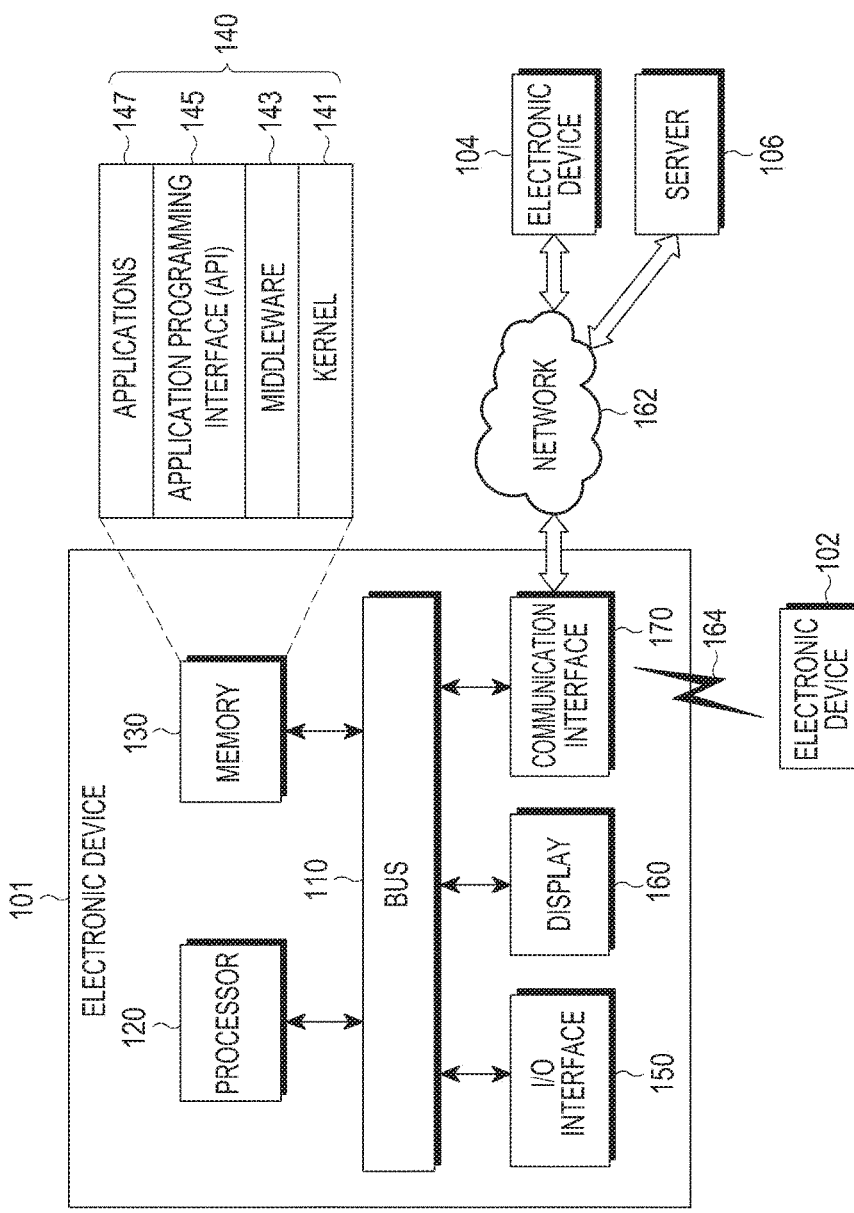
FIG. 1 is a block diagram illustrating an electronic device in a network environment according to an embodiment of the present disclosure.

The following description with reference to the accompanying drawings is provided to assist in a comprehensive understanding of various embodiments of the present disclosure as defined by the claims and their equivalents. It includes various specific details to assist in that understanding, but these are to be regarded as merely exemplary. Accordingly, those of ordinary skill in the art will recognize that various changes and modifications of the various embodiments described herein can be made without departing from the spirit and scope of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only, and not for the purpose of limiting the present disclosure as defined by the appended claims and their equivalents.

It is to be understood that the singular forms "a", "an", and "the", include plural referents unless the context clearly dictates otherwise. Thus, for example, reference to "a component surface" includes reference to one or more of such surfaces.

As used herein, the terms "have," "may have," "include," or "may include" a feature (e.g., a number, function, operation, or component such as a part) indicate the existence of the feature, but do not exclude the existence of other features.

As used herein, the terms "A or B," "at least one of A and/or B," or "one or more of A and/or B" may include all possible combinations of A and B. For example, "A or B," "at least one of A and B," "at least one of A or B" may indicate all of (1) including at least one A, (2) including at least one B, or (3) including at least one A and at least one B.

As used herein, the terms "first" and "second" may modify various components regardless of importance and/or order, and are used to distinguish a component from another without limiting the components. For example, a first user device and a second user device may indicate user devices different from each other, regardless of the order or importance of the devices. For example, a first component may be denoted as a second component, and vice versa, without departing from the scope of the present disclosure.

It will be understood that when an element (e.g., a first element) is referred to as being operatively or communicatively "coupled with/to," or "connected with/to" another element (e.g., a second element), it can be coupled or connected with/to the other element directly or via a third element. In contrast, it will be understood that when an element (e.g., a first element) is referred to as being "directly coupled with/to" or "directly connected with/to" another element (e.g., a second element), no other element (e.g., a third element) intervenes between the element and the other element.

As used herein, the terms "configured (or set) to" may be interchangeably used with the terms "suitable for," "having the capacity to," "designed to," "adapted to," "made to," or "capable of" depending on circumstances. The term "configured (or set) to" does not essentially mean "specifically designed in hardware to." Rather, the term "configured to" may mean that a device can perform an operation together with another device or parts. For example, the term "processor configured (or set) to perform A, B, and C" may mean a generic-purpose processor (e.g., a central processing unit (CPU) or application processor (AP)) that may perform the operations by executing one or more software programs stored in a memory device or a dedicated processor (e.g., an embedded processor) for performing the operations.

The terms including technical and scientific terms used herein have the same meaning as commonly understood by one of ordinary skill in the art to which various embodiments of the present disclosure belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some cases, the terms defined herein should not be interpreted to exclude various embodiments of the present disclosure.

Examples of the electronic device according to various embodiments of the present disclosure may include at least one of a smartphone, tablet personal computer (PC), mobile phone, video phone, e-book reader, desktop PC, laptop computer, netbook computer, workstation, personal digital assistant (PDA), portable multimedia player (PMP), Moving Picture Experts Group phase 1 or phase 2 (MPEG-1 or MPEG-2) audio layer III (MP3) player, mobile medical device, camera, or wearable device. According to an embodiment of the present disclosure, the wearable device may include at least one of an accessory-type device (e.g., a watch, ring, bracelet, anklet, necklace, glasses, contact lenses, or head-mounted device (HMD)), a fabric- or clothes-integrated device (e.g., electronic clothes), a body attaching-type device (e.g., a skin pad or tattoo), or a body implantable device (e.g., an implantable circuit).

According to an embodiment of the present disclosure, the electronic device may be a home appliance. For example, examples of the home appliance may include at least one of a television (TV), digital versatile disc (DVD) player, audio player, refrigerator, air conditioner, cleaner, oven, microwave oven, washer, drier, air cleaner, set-top box, home automation control panel, security control panel, TV box (e.g., Samsung HomeSync™, Apple TV™, or Google TV™), gaming console (Xbox™ PlayStation™), electronic dictionary, electronic key, camcorder, or electronic picture frame.

According to an embodiment of the present disclosure, examples of the electronic device may include at least one of various medical devices (e.g., diverse portable medical measuring devices (a blood sugar measuring device, heartbeat measuring device, or body temperature measuring device), a magnetic resource angiography (MRA) device, a magnetic resource imaging (MRI) device, a computed tomography (CT) device, an imaging device, or an ultrasonic device), a navigation device, a global navigation satellite system (GNSS) receiver, an event data recorder (EDR), a flight data recorder (FDR), an automotive infotainment device, a sailing electronic device (e.g., a sailing navigation device or gyro compass), avionics, security devices, vehicular head units, industrial or home robots, automatic teller's machines (ATMs), point of sales (POS) devices, or Internet of things devices (e.g., a bulb, various sensors, electric or gas meter, sprinkler, fire alarm, thermostat, street light, toaster, fitness equipment, hot water tank, heater, or boiler).

According to various embodiments of the disclosure, examples of the electronic device may include or be incorporated with at least one part of furniture or building/structure, an electronic board, an electronic signature receiving device, a projector, or various measurement devices (e.g., devices for measuring water, electricity, gas, or electromagnetic waves). According to an embodiment of the present disclosure, the electronic device may be one or a combination of the above-listed devices. According to an embodiment of the present disclosure, the electronic device may be a flexible electronic device. The electronic device disclosed herein is not limited to the above-listed devices, and may include new electronic devices depending on the development of technology.

Hereinafter, electronic devices are described with reference to the accompanying drawings, according to various embodiments of the present disclosure. As used herein, the term "user" may denote a human or another device (e.g., an artificial intelligent electronic device) using the electronic device.

FIG. 1 is a block diagram illustrating an electronic device in a network environment according to an embodiment of the present disclosure.

Referring to FIG. 1, the electronic device 101 may include a bus 110, a processor 120, a memory 130, an input/output interface 150, a display 160, and a communication interface 170. In various embodiments, the electronic device 101 may exclude at least one of the illustrated components or may add other components.

The bus 110 may include a circuit for connecting the components with one another and transferring communications (e.g., control messages and/or data) between the components.

The processing module 120 may include one or more of a CPU, an AP, or a communication processor (CP). The processor 120 may perform control on at least one of the components of the electronic device 101, and/or perform an operation or data processing relating to communication.

The memory 130 may include a volatile and/or non-volatile memory. For example, the memory 130 may store commands or data related to at least one component of the electronic device 101. According to an embodiment of the present disclosure, the memory 130 may store software and/or a program 140. The program 140 may include, e.g., a kernel 141, middleware 143, an application programming interface (API) 145, and/or an application program 147 (an "application" or "app"). At least a portion of the kernel 141, middleware 143, or API 145 may be denoted and operate as an operating system (OS).

For example, the kernel 141 may control or manage system resources (e.g., the bus 110, processor 120, or memory 130) used to perform operations or functions implemented in other programs (e.g., the middleware 143, API 145, or application program 147). The kernel 141 may provide an interface that allows the middleware 143, API 145, or application 147 to access the individual components of the electronic device 101 to control or manage the system resources.

The middleware 143 may function as a relay to allow the API 145 or the application 147 to communicate data with the kernel 141, for example.

Further, the middleware 143 may process one or more task requests received from the application program 147 in order of priority. For example, the middleware 143 may assign at least one of application programs 147 with priority for using system resources (e.g., the bus 110, processor 120, or memory 130) of at least one electronic device 101. For example, the middleware 143 may perform scheduling or load balancing for the one or more task requests by processing the one or more task requests according to the priority assigned to the at least one application program 147.

The API 145 is an interface allowing the application 147 to control functions provided from the kernel 141 or the middleware 143. For example, the API 145 may include at least one interface or function (e.g., a command) for filing control, window control, image processing or text control.

The input/output interface 150 may serve as an interface that may, e.g., transfer commands or data input from a user or other external devices to other component(s) of the electronic device 101. Further, the input/output interface 150 may output commands or data received from other component(s) of the electronic device 101 to the user or the other external device.

The display 160 may include, e.g., a liquid crystal display (LCD), light emitting diode (LED) display, organic LED (OLED) display, microelectromechanical systems (MEMS) display, or electronic paper display. The display 160 may display, e.g., various contents (e.g., text, images, videos, icons, or symbols) to the user. The display 160 may also include a touchscreen and may receive, e.g., a touch, gesture, proximity or hovering input using an electronic pen or a body portion of the user.

For example, the communication interface 170 may set up communication between the electronic device 101 and an external electronic device (e.g., a first electronic device 102, second electronic device 104, or server 106). For example, the communication interface 170 may be connected with a network 162 through wireless or wired communication to communicate with the external electronic device.

The wireless communication may be a cellular communication protocol and may use at least one of, e.g., long-term evolution (LTE), LTE-advanced (LTE-A), code division multiple access (CDMA), wideband CDMA (WCDMA), universal mobile telecommunications system (UMTS), wireless broadband (WiBro), or global system for mobile communications (GSM). Further, the wireless communication may include, e.g., short-range communication 164. The short-range communication 164 may include at least one of Wi-Fi, Bluetooth, near-field communication (NFC), or GNSS. The GNSS may include at least one of, e.g., global positioning system (GPS), global navigation satellite system (GLONASS), Bijou navigation satellite system (hereinafter, "BeiDou") or Galileo, or the European global satellite-based navigation system. Hereinafter, the terms "GPS" and the "GNSS" may be interchangeably used. The wired connection may include at least one of a universal serial bus (USB), high definition multimedia interface (HDMI), recommended standard 232 (RS-232), or plain old telephone service (POTS). The network 162 may include at least one of telecommunication networks, e.g., a computer network (e.g., local area network (LAN) or wide area network (WAN)), Internet, or a telephone network.

The first and second external electronic devices 102 and 104 each may be a device of the same or different type as the electronic device 101. According to an embodiment of the present disclosure, the server 106 may include a group of one or more servers. According to an embodiment of the present disclosure, all or some of operations executed on the electronic device 101 may be executed on another or multiple other electronic devices (e.g., the electronic devices 102 and 104 or server 106). According to an embodiment of the present disclosure, when the electronic device 101 should perform some function or service automatically or at a request, the electronic device 101, instead of executing the function or service on its own or additionally, may request another device (e.g., electronic devices 102 and 104 or server 106) to perform at least some functions associated therewith. The other electronic device (e.g., electronic devices 102 and 104 or server 106) may execute the requested functions or additional functions and transfer a result of the execution to the electronic device 101. The electronic device 101 may provide a requested function or service by processing the received result as it is or additionally. To that end, cloud computing, distributed computing, or client-server computing techniques may be used, for example.

Figure 2:
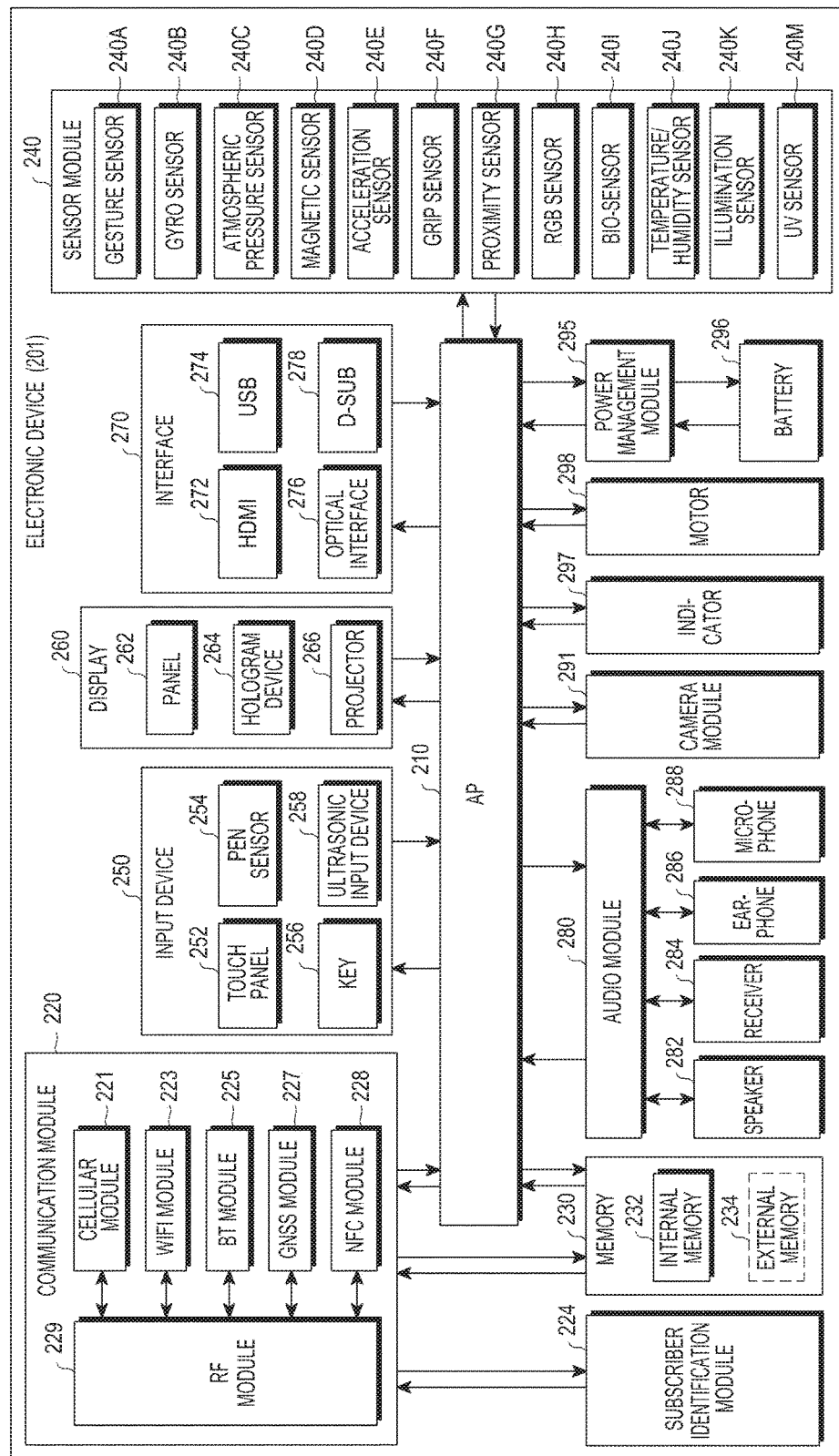
FIG. 2 is a block diagram illustrating an electronic device according to an embodiment of the present disclosure.

FIG. 2 is a block diagram illustrating an electronic device according to an embodiment of the present disclosure.

Referring to FIG. 2, an electronic device 201 may include the whole or part of the configuration of, e.g., the electronic device 101 shown in FIG. 1. The electronic device 201 may include one or more processors (e.g., APs) 210, a communication module 220, a subscriber identification module (SIM) 224, a memory 230, a sensor module 240, an input device 250, a display 260, an interface 270, an audio module 280, a camera module 291, a power management module 295, a battery 296, an indicator 297, and a motor 298.

The processor 210 may control multiple hardware and software components connected to the processor 210 by running, e.g., an operating system or application programs, and may process and compute various data. The processor 210 may be implemented as, e.g., a system on chip (SoC). According to an embodiment of the present disclosure, the processor 210 may further include a graphics processing unit (GPU) and/or an image signal processor. The processor 210 may include at least some (e.g., the cellular module 221) of the components shown in FIG. 2. The processor 210 may load a command or data received from at least one of the components (e.g., a non-volatile memory) on a volatile memory, process the command or data, and store various data in the non-volatile memory.

The communication module 220 may have the same or similar configuration as the communication interface 170 of FIG. 1. The communication module 220 may include, e.g., a cellular module 221, a Wi-Fi module 223, a Bluetooth module 225, a GNSS module 227, an NFC module 228, and a radio frequency (RF) module 229.

The cellular module 221 may provide voice call, video call, text, or Internet services through, e.g., a communication network. The cellular module 221 may perform identification or authentication of the electronic device 201 in the communication network using the SIM 224 (e.g., the SIM card). According to an embodiment of the present disclosure, the cellular module 221 may perform at least some of the functions providable by the processor 210. According to an embodiment of the present disclosure, the cellular module 221 may also include a CP.

The Wi-Fi module 223, Bluetooth module 225, GNSS module 227, or NFC module 228 may include a processor for, e.g., processing data communicated through the module. At least some (e.g., two or more) of the cellular module 221, Wi-Fi module 223, Bluetooth module 225, GNSS module 227, or NFC module 228 may be included in a single integrated circuit (IC) or an IC package.

The RF module 229 may provide communications between components and other devices or networks, e.g., communication signals (e.g., RF signals). The RF module 229 may include, e.g., a transceiver, power amp module (PAM), frequency filter, low noise amplifier (LNA), or antenna. According to an embodiment of the present disclosure, at least one of the cellular module 221, Wi-Fi module 223, Bluetooth module 225, GNSS module 227, or NFC module 228 may communicate RF signals through a separate RF module.

The SIM 224 may include, e.g., a card including a SIM and/or an embedded SIM, and may contain unique identification information (e.g., an IC card identifier (ICCID) or subscriber information (e.g., an international mobile subscriber identity (IMSI)).

The memory 230 (e.g., the memory 130) may include, e.g., an internal memory 232 or an external memory 234. The internal memory 232 may include at least one of, e.g., a volatile memory (e.g., a dynamic random access memory (DRAM), static RAM (SRAM), synchronous dynamic RAM (SDRAM), etc.) or non-volatile memory (e.g., a one-time programmable read only memory (OTPROM), programmable ROM (PROM), erasable and programmable ROM (EPROM), electrically erasable and programmable ROM (EEPROM), mask ROM, flash ROM, flash memory (e.g., a NAND flash, or NOR flash), hard drive, or solid state drive (SSD).

The external memory 234 may include a flash drive, e.g., a compact flash (CF) memory, secure digital (SD) memory, micro-SD memory, mini-SD memory, extreme digital (xD) memory, or memory Stick™. The external memory 234 may be functionally and/or physically connected with the electronic device 201 via various interfaces.

The sensor module 240 may measure a physical quantity or detect an operational state of the electronic device 201, and may convert the measured or detected information into an electrical signal. The sensor module 240 may include at least one of, e.g., a gesture sensor 240A, a gyro sensor 240B, an atmospheric pressure sensor 240C, a magnetic sensor 240D, an acceleration sensor 240E, a grip sensor 240F, a proximity sensor 240G, a color sensor 240H (e.g., a red-green-blue (RGB) sensor, a bio sensor 240I, a temperature/humidity sensor 240J, an illumination sensor 240K, or an ultra violet (UV) sensor 240M.

Additionally or alternatively, the sensing module 240 may include, e.g., an E-nose sensor, electromyography (EMG) sensor, electroencephalogram (EEG) sensor, electrocardiogram (ECG) sensor, infrared (IR) sensor, iris sensor, or finger print sensor. The sensor module 240 may further include a control circuit for controlling at least one or more of the sensors included in the sensing module. According to an embodiment of the present disclosure, the electronic device 201 may further include a processor configured to control the sensor module 240 as part of an AP 210 or separately from the AP 210, and the electronic device 1501 may control the sensor module 240 to remain active while the AP is in a sleep mode.

The input unit 250 may include, e.g., a touch panel 252, a (digital) pen sensor 254, a key 256, or an ultrasonic input device 258. The touch panel 252 may use at least one of capacitive, resistive, infrared, or ultrasonic methods. The touch panel 252 may further include a control circuit. The touch panel 252 may still further include a tactile layer and may provide a user with a tactile reaction.

The (digital) pen sensor 254 may include, e.g., a part of a touch panel or a separate sheet for recognition. The key 256 may include e.g., a physical button, optical key or keypad. The ultrasonic input device 258 may use an input tool that generates an ultrasonic signal and enable the electronic device 201 to identify data by sensing the ultrasonic signal using a microphone (e.g., a microphone 288).

The display 260 (e.g., the display 160) may include a panel 262, a hologram device 264, or a projector 266. The panel 262 may have the same or similar configuration to the display 160 of FIG. 1. The panel 262 may be implemented to be flexible, transparent, impact-resistant, or wearable. The panel 262 may also be incorporated with the touch panel 252 in a module.

The hologram device 264 may display three dimensional (3D) images (holograms) in the air by using light interference. The projector 266 may display an image by projecting light onto a screen. The screen may be, for example, located inside or outside of the electronic device 201. In accordance with an embodiment, the display 260 may further include a control circuit to control the panel 262, the hologram device 264, or the projector 266.

The interface 270 may include e.g., an HDMI 272, a USB 274, an optical interface 276, or a D-subminiature (D-sub) 278. The interface 270 may be included in e.g., the communication interface 170 shown in FIG. 1. Additionally or alternatively, the interface 270 may include a mobile high-definition link (MHL) interface, an SD card/multimedia card (MMC) interface, or infrared data association (IrDA) standard interface.

The audio module 280 may convert a sound into an electric signal or vice versa, for example. At least a part of the audio module 280 may be included in e.g., the input/output interface 150 as shown in FIG. 1. The audio module 280 may process sound information input or output through e.g., a speaker 282, a receiver 284, an earphone 286, or the microphone 288.

For example, the camera module 291 may be a device for capturing still images and videos, and may include, according to an embodiment of the present disclosure, one or more image sensors (e.g., front and back sensors), a lens, an image signal processor (ISP), or a flash such as an LED or xenon lamp.

The power manager module 295 may manage power of the electronic device 201, for example. Although not shown, according to an embodiment of the present disclosure, the power manager module 295 may include a power management IC (PMIC), charger IC, or battery or fuel gauge. The PMIC may have a wired and/or wireless recharging scheme. The wireless charging scheme may include e.g., a magnetic resonance scheme, acoustic resonance scheme, magnetic induction scheme, or electromagnetic wave based scheme, and an additional circuit, such as a coil loop, resonance circuit, rectifier, or the like may be added for wireless charging. The battery gauge may measure an amount of remaining power of the battery 296, voltage, current, or temperature while the battery 296 is being charged. The battery 296 may include, e.g., a rechargeable battery or solar battery.

The indicator 297 may indicate a particular state of the electronic device 201 or a part (e.g., the processor 210) of the electronic device, including e.g., a booting state, message state, or recharging state. The motor 298 may convert an electric signal to a mechanical vibration and may generate a vibrational or haptic effect. Although not shown, a processing unit for supporting mobile TV, such as a GPU may be included in the electronic device 201. The processing unit for supporting mobile TV may process media data conforming to a standard for digital multimedia broadcasting (DMB), digital video broadcasting (DVB), or mediaFLO™.

Each of the aforementioned components of the electronic device may include one or more parts, and a name of the part may vary with a type of the electronic device. The electronic device in accordance with various embodiments of the present disclosure may include at least one of the aforementioned components, omit some of them, or include other additional component(s). Some of the components may be combined into a single entity, but the entity may perform the same functions as the separate components.

Figure 3:
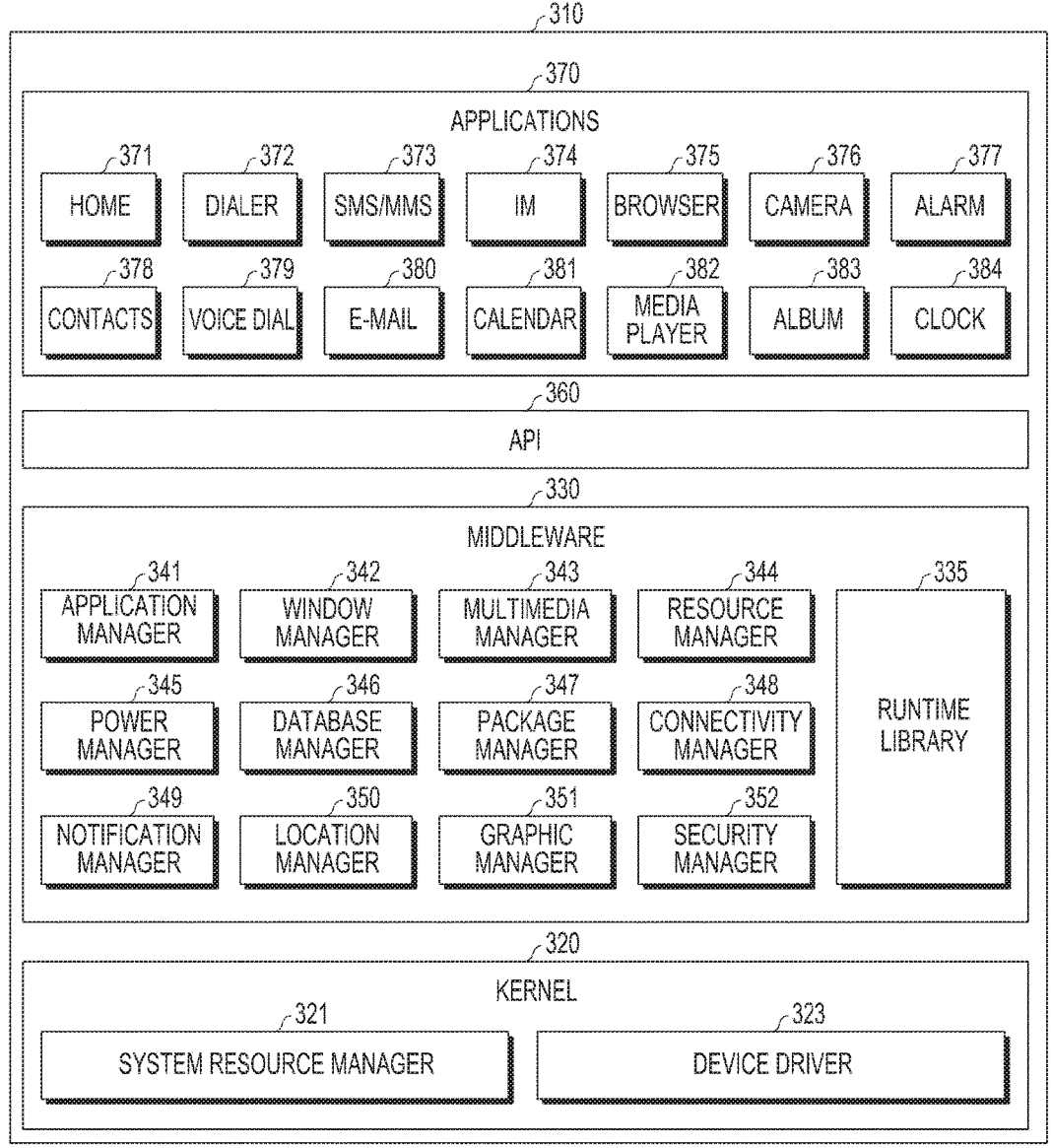
FIG. 3 is a block diagram illustrating a program module according to an embodiment of the present disclosure.

FIG. 3 is a block diagram illustrating a program module according to an embodiment of the present disclosure.

Referring to FIG. 3, according to an embodiment of the present disclosure, a program module 310 (e.g., the program 140) may include an OS controlling resources related to the electronic device (e.g., the electronic device 101) and/or various applications (e.g., the AP 147) driven on the operating system. The operating system may include, e.g., Android, iOS, Windows, Symbian, Tizen, or Bada.

The program module 310 may include, e.g., a kernel 320, middleware 330, an API 360, and/or an application 370. At least a part of the program module 310 may be preloaded on the electronic device or may be downloaded from an external electronic device (e.g., the electronic devices 102 and 104) or a server (e.g., the server 106).

The kernel 320 (e.g., the kernel 141 of FIG. 1) may include, e.g., a system resource manager 321 or a device driver 323. The system resource manager 321 may perform control, allocation, or recovery of system resources. According to an embodiment of the present disclosure, the system resource manager 321 may include a process managing unit, a memory managing unit, or a file system managing unit. The device driver 323 may include, e.g., a display driver, camera driver, Bluetooth driver, shared memory driver, USB driver, keypad driver, Wi-Fi driver, audio driver, or an inter-process communication (IPC) driver.

The middleware 330 may provide various functions to the application 370 through the API 360 so that the application 370 may efficiently use limited system resources in the electronic device or provide functions jointly required by applications 370. According to an embodiment of the present disclosure, the middleware 330 (e.g., middleware 143) may include at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, or a security manager 352.

The runtime library 335 may include a library module used by a compiler in order to add a new function through a programming language while, e.g., the application 370 is being executed. The runtime library 335 may perform input/output management, memory management, or operation on arithmetic functions.

The application manager 341 may manage the life cycle of at least one application of, e.g., the applications 370. The window manager 342 may manage graphical UI (GUI) resources used on the screen. The multimedia manager 343 may grasp formats necessary to play various media files and use a codec appropriate for a format to perform encoding or decoding on media files. The resource manager 344 may manage resources, such as source code of at least one of the applications 370, memory or storage space.

The power manager 345 may operate together with, e.g., a basic input/output system (BIOS) to manage battery or power, and provide power information necessary for operating the electronic device. The database manager 346 may generate, search, or vary a database to be used in at least one of the applications 370. The package manager 347 may manage installation or update of an application that is distributed in the form of a package file.

The connectivity manager 348 may manage wireless connectivity, such as, e.g., Wi-Fi or Bluetooth. The notification manager 349 may display or notify an event, such as a coming message, appointment, or proximity notification, of the user without interfering with the user. The location manager 350 may manage locational information on the electronic device. The graphic manager 351 may manage graphic effects to be offered to the user and their related user interface. The security manager 352 may provide various security functions necessary for system security or user authentication. According to an embodiment of the present disclosure, when the electronic device (e.g., the electronic device 101) has telephony capability, the middleware 330 may further include a telephony manager for managing voice call or video call functions of the electronic device.

The middleware 330 may include a middleware module forming a combination of various functions of the above-described components. The middleware 330 may provide a specified module per type of operating system in order to provide a differentiated function. Further, the middleware 330 may dynamically omit some existing components or add new components.

The API 360 (e.g., the API 145) may be a set of, e.g., API programming functions and may have different configurations depending on operating systems. For example, in the case of Android or iOS, one API set may be provided per platform, and in the case of Tizen, two or more API sets may be offered per platform.

The application 370 (e.g., the AP 147) may include one or more applications that may provide functions such as, e.g., a home 371, a dialer 372, a short message service (SMS)/multimedia messaging service (MMS) 373, an instant message (IM) 374, a browser 375, a camera 376, an alarm 377, a contact 378, a voice dial 379, an email 380, a calendar 381, a media player 382, an album 383, or a clock 384, a health-care (e.g., measuring the degree of workout or blood sugar), or provision of environmental information (e.g., provision of air pressure, moisture, or temperature information).

According to an embodiment of the present disclosure, the application 370 may also include an application (hereinafter, "information exchanging application" for convenience) supporting information exchange between the electronic device (e.g., the electronic device 101) and an external electronic device (e.g., the electronic devices 102 and 104). Examples of the information exchange application may include, but is not limited to, a notification relay application for transferring specific information to the external electronic device, or a device management application for managing the external electronic device.

For example, the notification relay application may include a function for relaying notification information generated from other applications of the electronic device (e.g., the SMS/MMS application, email application, health-care application, or environmental information application) to the external electronic device (e.g., the electronic devices 102 and 104). Further, the notification relay application may receive notification information from, e.g., the external electronic device and may provide the received notification information to the user.

The device management application may perform at least some functions of the external electronic device (e.g., the electronic device 102 or 104) communicating with the electronic device (for example, turning on/off the external electronic device or components of the external electronic device, or control brightness or resolution of the display), and the device management application may manage (e.g., install, delete, or update) an application operating in the external electronic device or a service (e.g., call service or message service) provided from the external electronic device.

According to an embodiment of the present disclosure, the application 370 may include an application (e.g., a health-care application of a mobile medical device) designated according to an attribute of the external electronic device (e.g., the electronic devices 102 and 104). According to an embodiment of the present disclosure, the application 370 may include an application received from the external electronic device (e.g., the server 106 or electronic devices 102 and 104). According to an embodiment of the present disclosure, the application 370 may include a preloaded application or a third party application downloadable from a server. The names of the components of the program module 310 according to the shown embodiment may be varied depending on the type of operating system.

According to an embodiment of the present disclosure, at least a part of the program module 310 may be implemented in software, firmware, hardware, or in a combination of two or more thereof. At least a part of the programming module 310 may be implemented (e.g., executed) by e.g., a processor (e.g., the processor 120). At least a part of the program module 310 may include e.g., a module, program, routine, set of instructions, process, or the like, for performing one or more functions.

The term "module" may refer to a unit including one of hardware, software, and firmware, or a combination thereof. The term "module" may be interchangeably used with terms such as "unit", "logic", "logical block", "component", or "circuit". The module may be a minimum unit or part of an integrated component. The module may also be a minimum unit or part of performing one or more functions. The module may be implemented mechanically, electronically, or in a combination thereof.

For example, the module may include at least one or more of application specific IC (ASIC) chips, field programmable gate arrays (FPGAs), or programmable logic arrays (PLAs) that perform some operations, which are known or will be developed in the future.

According to an embodiment of the present disclosure, at least a part of the device (e.g., modules or their functions) or method (e.g., operations) may be implemented as instructions stored in a computer-readable storage medium e.g., in the form of a program module. The instructions, when executed by a processor (e.g., the processor 120), may enable the processor to carry out a corresponding function. The computer-readable storage medium may be e.g., the memory 130.

The computer-readable storage medium may include a hardware device, such as hard disks, floppy disks, and magnetic tapes (e.g., a magnetic tape), optical media such as compact disc ROMs (CD-ROMs) and DVDs, magneto-optical media such as floptical disks, ROMs, RAMs, flash memories, and/or the like. Examples of the program instructions may include not only machine language codes but also high-level language codes which are executable by various computing means using an interpreter. The aforementioned hardware devices may be configured to operate as one or more software modules to carry out various embodiments of the present disclosure, and vice versa.

Modules or programming modules in accordance with various embodiments of the present disclosure may include at least one or more of the aforementioned components, omit some of them, or include other additional components. Operations performed by modules, programming modules or other components in accordance with various embodiments of the present disclosure may be carried out sequentially, simultaneously, repeatedly, or heuristically. Furthermore, some of the operations may be performed in a different order, omitted, or include other additional operation(s). The embodiments disclosed herein are proposed for description and understanding of the disclosed technology and do not limit the scope of the present disclosure. Accordingly, the scope of the present disclosure should be interpreted as including all changes or various embodiments based on the technical spirit of the present disclosure.

Figure 4:
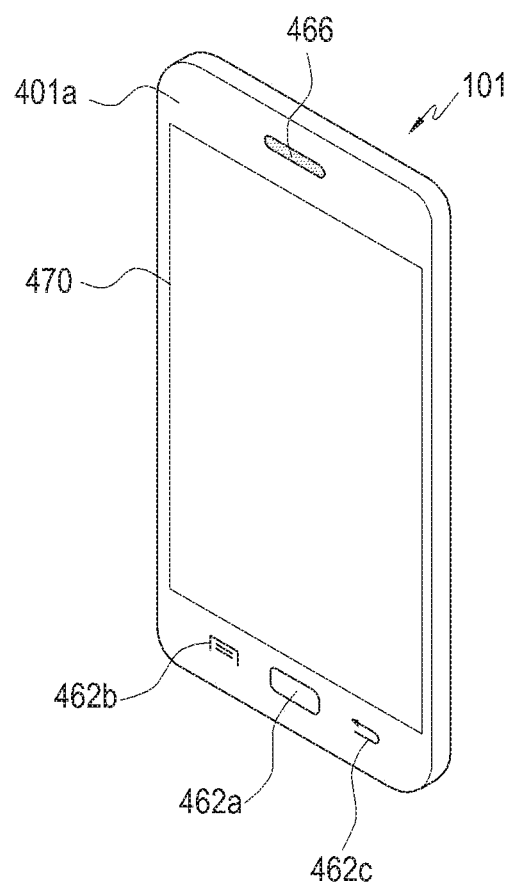
FIG. 4 is a perspective view illustrating an electronic device according to an embodiment of the present disclosure.

FIG. 4 is a perspective view illustrating an electronic device according to an embodiment of the present disclosure.

Referring to FIG. 4, a touchscreen 470 may be disposed at the center of the front surface 401a of a housing of an electronic device 101. The touchscreen 470 may be formed to be large enough to occupy substantially the entire front surface 401a, but embodiments are not limited thereto. The touchscreen 470 may display various screens. A home button 462a, a menu button 462b, and a go-back button 462c may be provided on a lower portion of the touch screen 470 or front surface 401a. The home button 462a when touched may display the main home screen on the touch screen 470. For example, when the home button 462a is touched, the main home screen may be displayed on the touchscreen 470. When the home button 462a is touched while applications are running on the touch screen 470, the main home screen may be displayed on the touch screen 470. The menu button 462b when touched may provide a connection menu that may be used on the touch screen 470. The connection menu may include an add widget menu, change background menu, search menu, edit menu, and setting menu. The go-back button 462c when touched may display the screen displayed immediately before the screen currently in execution, or may terminate the latest application used. A speaker 466 may be disposed on an upper portion of the front surface 401a of the electronic device 101. The home button 462a, the menu button 462b, and the go-back button 462c may be changed in position there between, and they may be displayed as virtual buttons on a portion of the touchscreen 470.

According to an embodiment of the present disclosure, the electronic device 101 may include a communication device, controller, power device, storage device, display device, sensor device, and an input device. Further, the sensor device may include a sensor device such as a grip sensor. The sensor device (i.e., the grip sensor) may be a device adopting a capacitive recognition sensing type which may sense a variation in capacitance when the user's body portion approaches the electronic device 101. Such sensing device may include a conductive pattern to sense a variation in capacitance. The conductive pattern may be a conductive material and may be disposed in a separate region inside the electronic device 101. For example, the conductive pattern may be deposited on a structure of the electronic device 101 or may be equipped in the electronic device 101 in the form of a flexible printed circuit board (FPCB). Further, the conductive pattern may share a portion of an antenna pattern. According to an embodiment of the present disclosure, such an antenna pattern may be disposed in various locations on the electronic device 101.

Figure 5A:
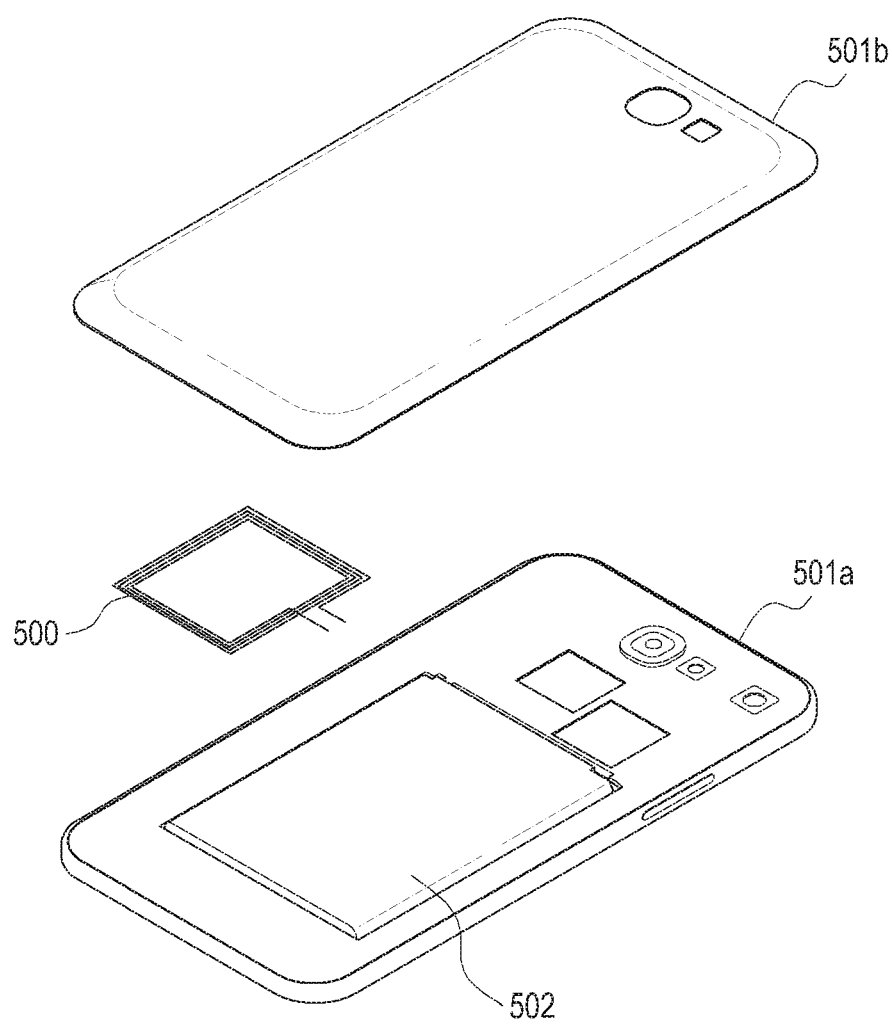
FIGS. 5A to 5C are perspective views illustrating examples in which an antenna is disposed between a main body and a back cover of an electronic device according to various embodiments of the present disclosure.
Figure 5B:
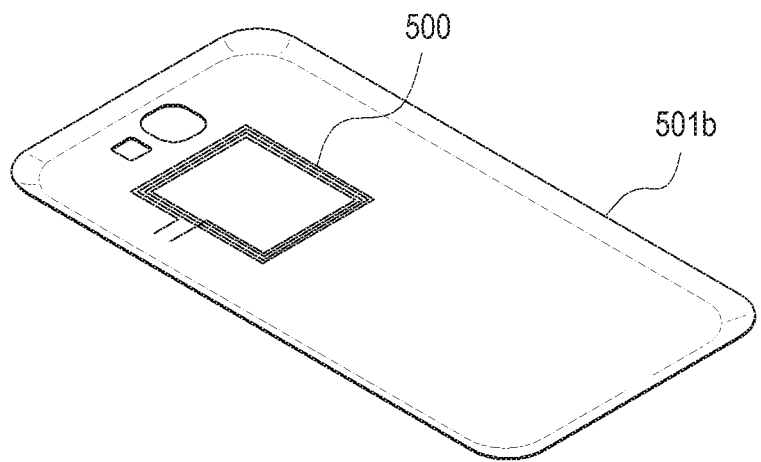
Figure 5C:
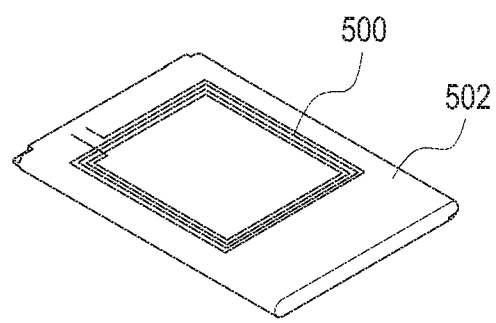

FIGS. 5A to 5C are perspective views illustrating examples in which an antenna is disposed between a main body and a back cover of an electronic device according to various embodiments of the present disclosure.

Referring to FIG. 5A, for example, an electronic device may include a main body 501a and a back cover 501b detachably provided to a rear surface of the main body 501a, and an antenna pattern 500 may be disposed between the main body 501a and the back cover 501b. A battery 502 may be seated on the rear surface of the main body 501a, and the back cover 501b may be coupled to the main body 501a while the battery is seated in the main body 501a, forming a housing.

Referring to FIG. 5B, the antenna pattern 500 may be attached to the back cover 501b. According to an embodiment of the present disclosure, the antenna pattern 500 may be in a form molded inside the back cover 501b.

Referring to FIG. 5C, the antenna pattern 500 may be attached to a battery 502 detachably provided to the main body 501a. According to an embodiment of the present disclosure, the conductive pattern of the sensor device may share a portion of the antenna pattern 500 or may be replaced with the antenna pattern 500.

Figure 6:
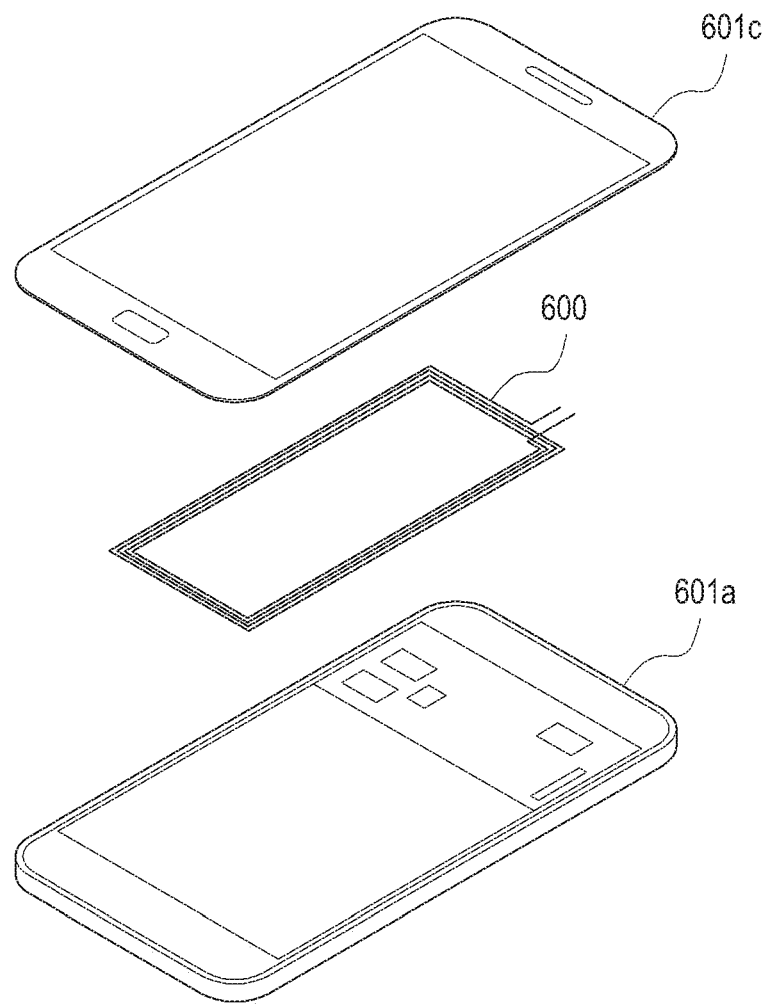
FIG. 6 is a perspective view illustrating an example in which an antenna is disposed between a main body and a front case of an electronic device according to various embodiments of the present disclosure.

FIG. 6 is a perspective view illustrating an example in which an antenna is disposed between a main body and a front case of an electronic device according to various embodiments of the present disclosure.

Referring to FIG. 6, an electronic device may include a main body 601a and a front case 601c attached to a front surface of the main body 601a, and an antenna pattern 600 may be disposed between the main body 601a and the front case 601c. According to an embodiment of the present disclosure, the front case 601c may be a window member. The antenna pattern 600 positioned between the main body 601a and the front case 601c may be provided in a form of a pattern to operate as an antenna on at least a portion of the front case 601c. For example, the antenna pattern 600 may be provided in a form broadly and evenly spread on the overall front case. The antenna pattern 600 may also be provided in a form surrounding a bezel of a touch panel (e.g., a portion of the front case which is touched when held by the user's hand). According to an embodiment of the present disclosure, the conductive pattern of the sensor device may share a portion of the antenna pattern 600 or may be replaced with the antenna pattern 600.

Figure 7:
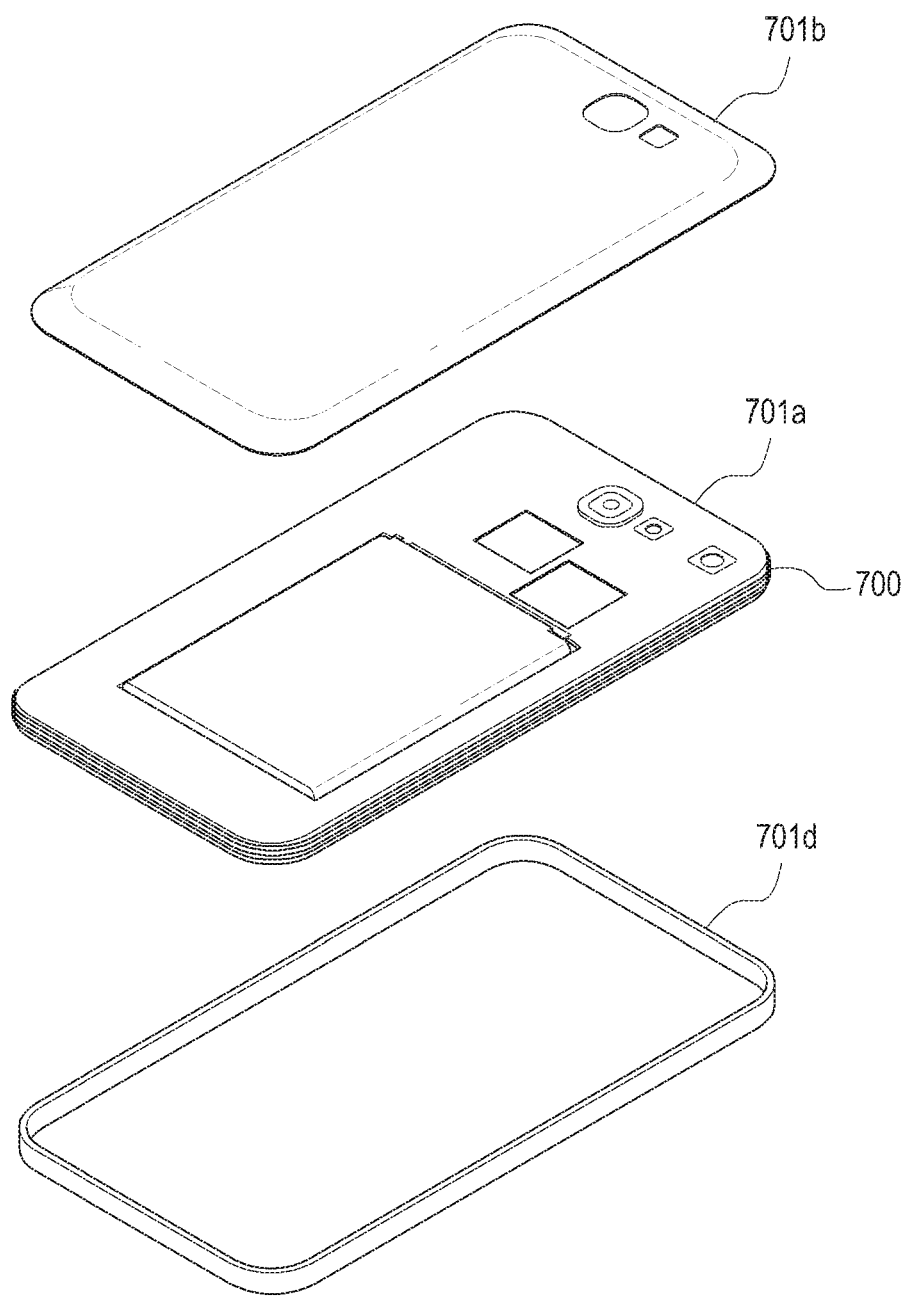
FIG. 7 is a perspective view illustrating an example in which an antenna is disposed on a side edge of an electronic device according to an embodiment of the present disclosure.

FIG. 7 is a perspective view illustrating an example in which an antenna is disposed on a side edge of an electronic device according to an embodiment of the present disclosure.

Referring to FIG. 7, an electronic device may include a main body 701a, a back cover 701b detachably provided to a rear surface of the main body 701a, and a side case 701d surrounding a side surface of the main body 701a. An antenna pattern 700 may be disposed on a side edge of the main body 701a, and the side case 701d may surround the antenna pattern 700 disposed on the side edge of the main body 701a.

According to an embodiment of the present disclosure, the back cover 701b and the side case 701d may be formed as a single body, the antenna pattern 700 may be disposed on the side edge of the main body 701a, and the single-body case of the back cover 701b and the side case 701d may surround the antenna pattern 700 disposed on the side edge of the main body 701a. According to an embodiment of the present disclosure, the conductive pattern of the sensor device may share a portion of the antenna pattern 700 or may be replaced with the antenna pattern 700.

Figure 8A:
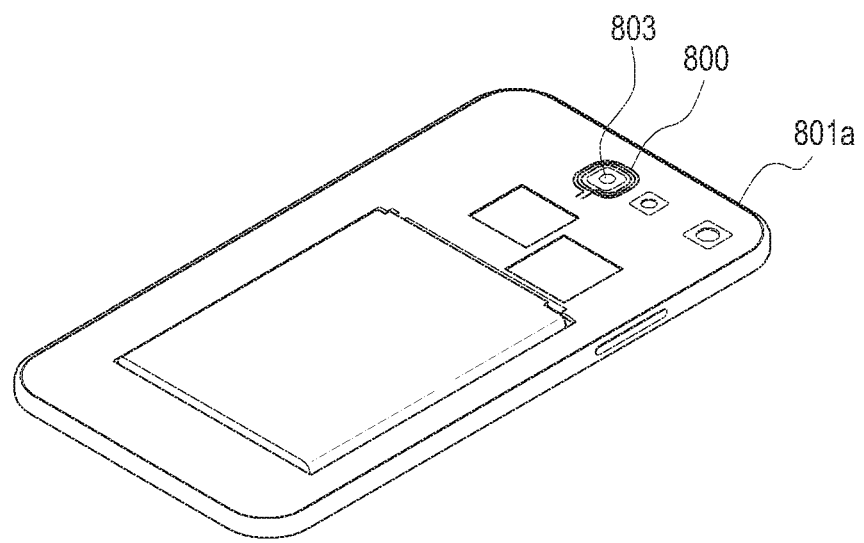
FIGS. 8A and 8B are perspective views illustrating examples in which an antenna is disposed around a camera of an electronic device according to various embodiments of the present disclosure.
Figure 8B:
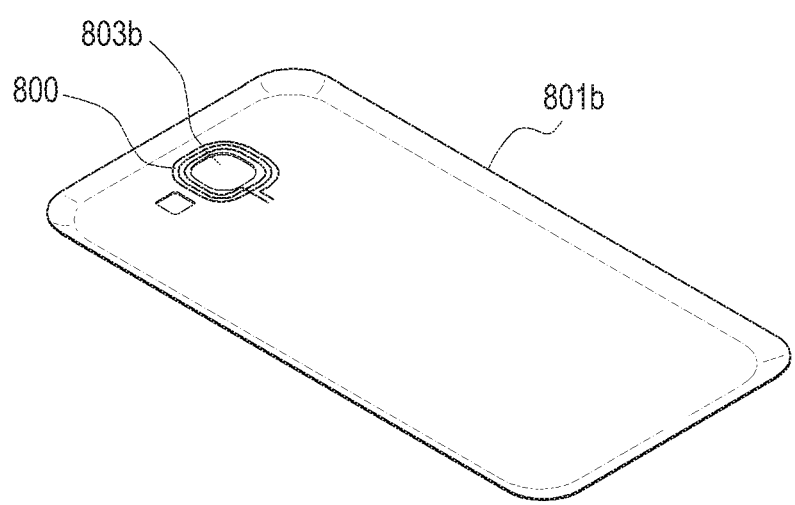

FIGS. 8A and 8B are perspective views illustrating examples in which an antenna is disposed around a camera of an electronic device according to various embodiments of the present disclosure.

Referring to FIGS. 8A and 8B, a camera 803 may be provided on a rear surface of the main body 801a, and an opening 803b where the camera 803 is received may be formed in a back cover 801b, corresponding to the position of the camera 803 in the main body 801a. According to an embodiment of the present disclosure, an antenna 800 may be attached around the camera 803 of the main body 801a as shown in FIG. 8A. According to an embodiment of the present disclosure, the antenna 800 may also be attached around the opening 803b where the camera 803 of the back cover 801b is received as shown in FIG. 8B. According to an embodiment of the present disclosure, the conductive pattern of the sensor device may share a portion of the antenna pattern 800 or may be replaced with the antenna pattern 800.

According to an embodiment of the present disclosure, a grip sensor pattern of the sensor device may be shared or replaced with the antenna device, and it may be disposed in various types in various positions other than the positions described above.

Figure 9A:
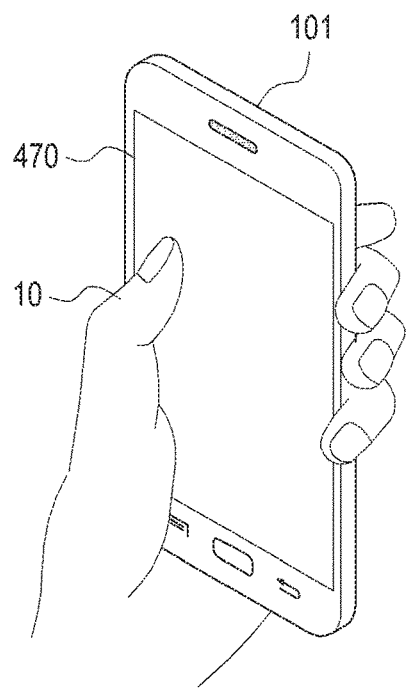
FIG. 9A is a perspective view illustrating a sensor while an electronic device contacts the same according to various embodiments of the present disclosure.
Figure 9B:
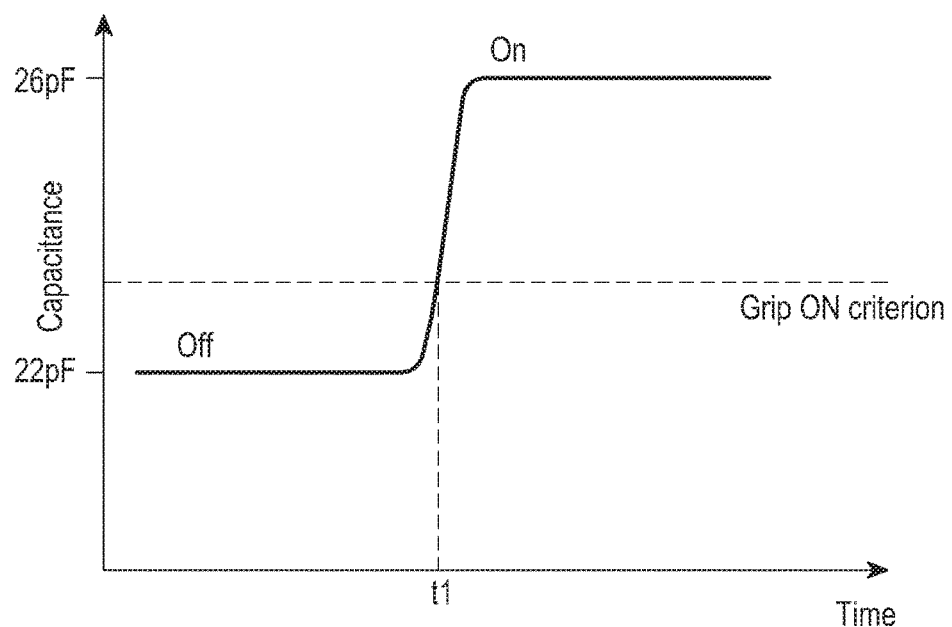
FIG. 9B is a graph illustrating a change in output from a sensor while an electronic device contacts the same according to various embodiments of the present disclosure.

FIGS. 9A and 9B illustrate changes in sensor output when an electronic device is contacted according to various embodiments of the present disclosure, wherein FIG. 9A is a perspective view illustrating an example in which a grip sensor of an electronic device is contacted, and FIG. 9B is a graph illustrating changes in output of a sensor when a grip sensor of an electronic device is contacted.

Referring to FIG. 9A, a user's hand 10 may contact an electronic device 101 as the user grips the electronic device 101. The term "grip" here may mean that the user holds, grips or otherwise positions or manipulates the electronic device 101 using a body portion contact. When the user's hand 10 contacts the electronic device 101, the capacitive component of the conductive pattern of the sensor device included in the electronic device 101 may exhibit a detectable capacitance component difference relative to a capacitance component before the contact.

Referring to FIG. 9B, the electronic device 101 may detect the capacitance component of the conductive pattern through the sensor device. When the user contacts the conductive pattern of the electronic device 101 at a particular time t1, the capacitance component of the conductive pattern increases, and when the level of the output signal detected by the sensor device is higher than the level of a sensing state reference level of the sensor, the electronic device 101 may determine that the user is in contact with some portion of the electronic device 101. For example, when the conductive pattern is not in contact with the user, a level of an output signal from the sensor device may be about 22 pF, and when the conductive pattern is in contact with the user, the level of the output signal from the sensor device may be about 26 pF.

A sensing state reference level (i.e., Grip ON criterion) for determining that the sensor is in contact with the user may be set to a level between the level of the output signal before contact and the level of the output signal in contact. Further, the sensor device may detect a hovering state where the user comes within a proximate distance from the conductive pattern, even when the user is not in contact with the electronic device 101. For example, when the conductive pattern is not in contact with the user, the level of the output signal from the sensor device may be about 22 pF, and in a hovering state where the user comes within a proximate distance from the conductive pattern, the level of the output signal from the sensor device may be about 22.3 pF. The sensing state reference level (not shown) for determining that the sensor is in the hovering state may be set to a level between the level of the output signal before contact and the level of the output signal when hovering, and this may be set to a value relatively lower than the sensing state reference level for determining the contacting state. According to an embodiment of the present disclosure, the sensing state reference level may be previously set through testing during the manufacturing process of the electronic device.

Figure 10:
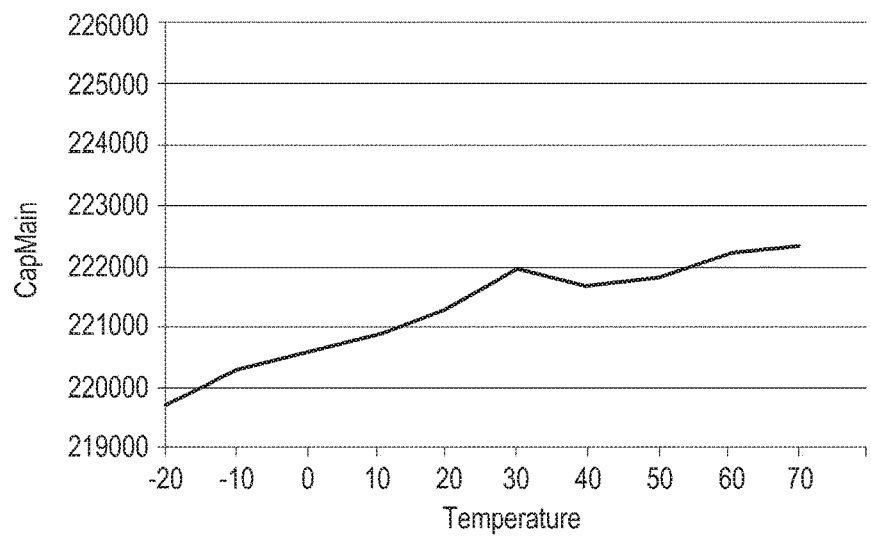
FIG. 10 is a graph illustrating a change in output from a sensor depending on variations in temperature according to an embodiment of the present disclosure.

FIG. 10 is a graph illustrating a change in output from a sensor depending on variations in temperature according to an embodiment of the present disclosure.

Referring to FIG. 10, a sensor device using a sensing type of recognizing capacitor may exhibit a deviation depending on temperatures. Such deviation may cause malfunctions when the sensing state reference level of the sensor is low. For example, the sensor device may detect a hovering state for the electronic device. Since the sensing state reference level for determining the hovering state is set to be a value relatively lower than the sensing state reference level for determining the contacting state, sensor deviation may cause malfunctions even with a tiny change in the output level due to a temperature variation. As shown in FIG. 10, a level of output signal from a grip sensor device may cause a variation depending on temperatures. For example, when the temperature changes from −20° C. to 60° C. and where no other variables are changed, a deviation of about 0.25 pF may occur.

Accordingly, according to an embodiment of the present disclosure, a method is proposed for allowing the grip sensor to stably determine a sensing state by preventing the grip sensor from malfunctioning in the electronic device. According to an embodiment of the present disclosure, the temperature of a portion of the electronic device may be measured, a sensing state reference level of the grip sensor may be set according to the measured temperature, and the sensing state of an external object for the electronic device may be determined according to a result of a comparison between an output level from the grip sensor and the sensing state reference level of the grip sensor as set. According to an embodiment of the present disclosure, the temperature of a portion of the electronic device may be measured, a sensing level applied to the grip sensor may be corrected according to the measured temperature, and the sensing state of an external object for the electronic device may be determined according to a result of a comparison between the output level from the grip sensor by the corrected sensing level and a predetermined sensing state reference level of the grip sensor.

Figure 11:
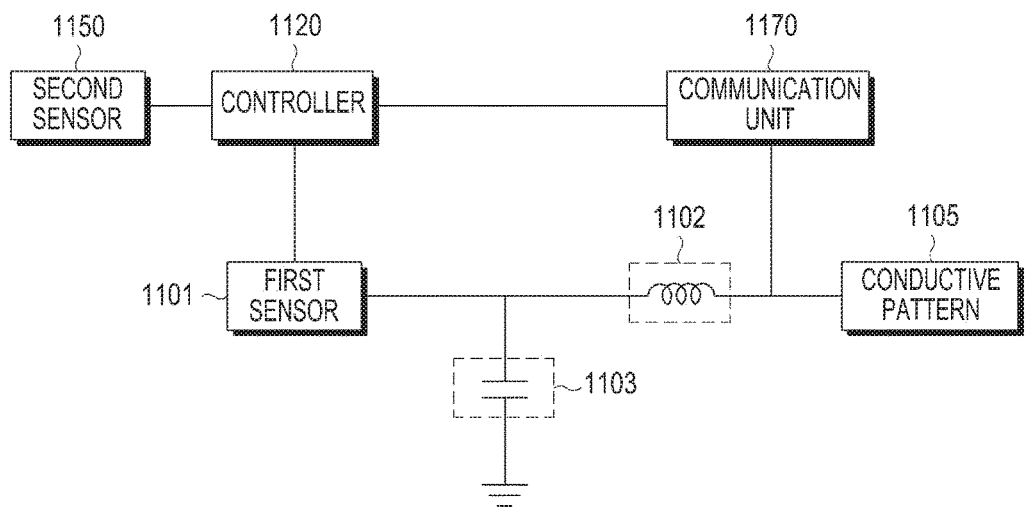
FIG. 11 is a block diagram illustrating a configuration of a grip sensor device according to an embodiment of the present disclosure.

FIG. 11 is a block diagram illustrating a configuration of a grip sensor device according to an embodiment of the present disclosure.

Referring to FIG. 11, according to an embodiment of the present disclosure, a grip sensor device may include a first sensor 1101, a conductive pattern 1105, a controller 1120, a second sensor 1150, and a communication unit 1170.

The first sensor 1101 may be a grip sensor module using a capacitive recognition sensing scheme and may be connected with the conductive pattern 1105 to measure a capacitance component generated from the conductive pattern 1105. The first sensor 1101 may sense a change in the capacitance component generated from the conductive pattern 1105, sense a hovering state or contact of the user to the electronic device, and may output a signal for the sensed result.

Here, a low pass filter (LPF) 1102 may be further provided between the first sensor 1101 and the conductive pattern 1105 to pass a lower frequency band. The LPF 1102 may allow transfer to the first sensor 1101 of only capacitance components at frequencies lower than a frequency required for the antenna operation when the conductive pattern 1105 functions as an antenna.

A capacitor 1103 may be further provided between the first sensor 1101 and ground to reduce noise and prevent influx of such noise to the first sensor 1101.

The conductive pattern 1105 may be a conductive material. According to an embodiment of the present disclosure, the conductive pattern 1105 may be disposed in a separate region inside the electronic device. For example, the conductive pattern 1105 may be deposited on a structure of the electronic device or may be equipped in the electronic device in the form of an FPCB. Further, the conductive pattern 1105 may share at least a portion of an antenna pattern.

The second sensor 1150 may measure the temperature of a portion of the electronic device. According to an embodiment of the present disclosure, at least one second sensor 1150 may be disposed at various positions on the electronic device. For example, the second sensor 1150 may be disposed around the first sensor 1101 or the conductive pattern 1105 and apart from heating parts. In doing so, the sensor device may be influenced primarily by the room temperature. Further, the second sensor 1150, rather than measuring the temperature of the inside of the electronic device, may receive external temperature information based on the position of the electronic device, and use the received temperature information. Further, the second sensor 1150 may also use temperature information obtained from a battery gauge of the electronic device or a device measuring the temperature of the battery.

The communication unit 1170 may communicate electromagnetic waves through the antenna to support data communication when the conductive pattern 1105 plays a role as an antenna.

The controller 1120 controls the overall operation of the sensor device and controls the operation of other components (e.g., the first sensor 1101, second sensor 1150, and communication unit 1170).

The controller 1120 may receive temperature information regarding a portion of the electronic device from the second sensor 1150, set a sensing state reference level of the first sensor 1101 according to the received temperature information, and determine a sensing state of an external object for the electronic device according to a result of a comparison between an output level of the first sensor 1101 and the sensing state reference level as set. For example, the controller 1120 may determine whether the external object is in contact or at least in a hovering state with respect to the electronic device.

According to an embodiment of the present disclosure, the sensing state reference level may be a preset value to determine a sensing state of an external object for the electronic device according to the level of an output signal detected by the first sensor 1105. The sensing state reference level may include at least one reference level to differentiate and determine various sensing states of the external object for the electronic device. For example, the sensing state reference level may include at least one of a reference level corresponding to the state where the external object is not in proximity to the electronic device, a reference level corresponding to the state where the external object is in contact with the electronic device, and a reference level corresponding to the state where the external object is in at least one hovering state with respect to the electronic device.

Further, the sensing state reference level may be a preset value differentiated for each of at least one temperature section. For example, a temperature range from −20° C. to 50° C. may be divided into 10° C. temperature sections, and a sensing state reference level may be set corresponding to each temperature section, but embodiments are not limited thereto. As an example, the sensing state reference level may be set as a predetermined value for each temperature section. In such cases, the sensing state reference level set per temperature section may be determined by selecting any one of the average value, reference value and mid value of the sensing state reference level in the temperature section. As another example, the sensing state reference level may be set as a slope linearly increasing or decreasing per temperature section. In such cases, the sensing state reference level set per temperature section may be set to a slope linearly connecting the start and end sensing state reference levels in the temperature section.

Further, the temperature sections may have different intervals, respectively. For example, the interval of the section with large value changes may be relatively reduced, while the interval of the section with small value changes may be relatively increased.

Figure 12:
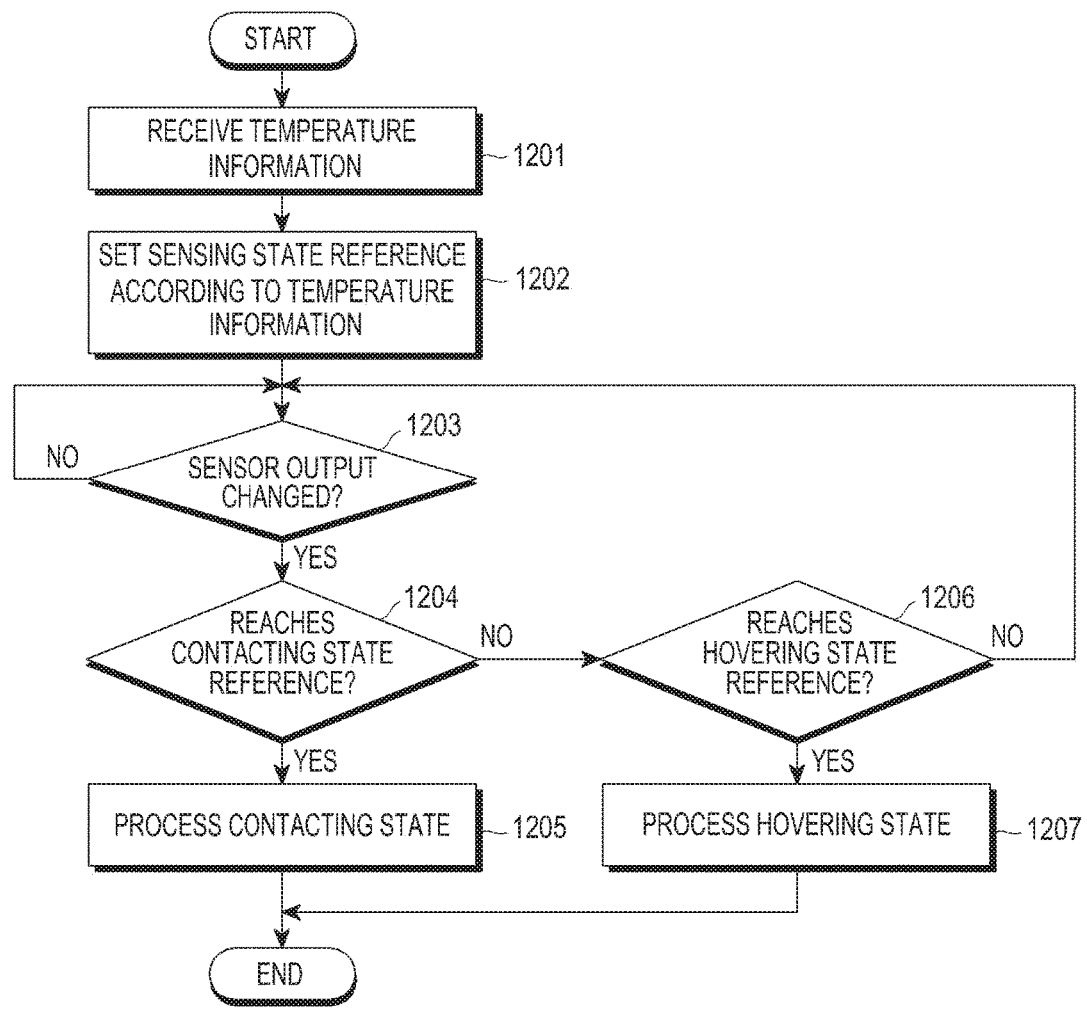
FIG. 12 is a flowchart illustrating a method for determining a sensing state using a grip sensor device according to an embodiment of the present disclosure.

FIG. 12 is a flowchart illustrating a method for determining a sensing state using a grip sensor device according to an embodiment of the present disclosure.

Referring to FIG. 12, an operation for determining a sensing state using a grip sensor device according to an embodiment of the present disclosure is described in detail.

In operation 1201, an electronic device 101 may receive temperature information regarding a portion of the electronic device using a temperature sensor. For example, the electronic device 101 may receive the temperature information of a surrounding area spaced apart from a heating part or insulated part of the electronic device 101. Further, rather than receiving the temperature information of the inside of the electronic device 101, an external temperature based on the position of the electronic device 101 may be received, and the received temperature information may be used.

In operation 1202, the electronic device 101 may set a sensing state reference level of the sensor according to the received temperature information. The sensing state reference level may be a preset value to determine a sensing state of an external object for the electronic device according to the level of an output signal detected by the sensor. The electronic device 101 may set the sensing state reference level of the sensor according to the temperature information by selecting a sensing state reference level corresponding to the received temperature information for a preset sensing state reference level according to the temperature information.

In operation 1203, the electronic device 101 may repeatedly sense whether the level of a signal output from the sensor changes. For example, the level of signal output from the sensor may be changed as an external object contacts or hovers over the electronic device.

In operation 1204, the electronic device 101 may identify the sensing state reference level set in operation 1202 when sensing a change in the level of signal output from the sensor and may first determine whether the external object is in contact with the electronic device by comparing the output level of the sensor and the preset sensing state reference level. In the determination operation, it may be determined whether the level of output from the sensor reaches the sensing state reference level for determining the contacting state that may show relatively the highest sensing state reference level among sensing state reference levels according to various sensing states. When the output level from the sensor reaches the sensing state reference level for the contacting state, the electronic device 101 may determine that the sensing state of the external object for the electronic device is a contacting state in operation 1205.

When it is determined in operation 1204 that the output level of the sensor does not reach the sensing state reference level for the contacting state, the electronic device 101 may determine in operation 1206 whether the level of output from the sensor reaches the sensing state reference level for determining the hovering state that may show relatively the lowest sensing state reference level among sensing state reference levels according to various sensing states. When the output level from the sensor reaches the sensing state reference level for the hovering state, the electronic device 101 may determine that the sensing state of the external object for the electronic device is a hovering state in operation 1207. If the output level from the sensor does not reach the sensing state reference level for the hovering state, the electronic device 101 returns to operation 1203.

Figure 13:
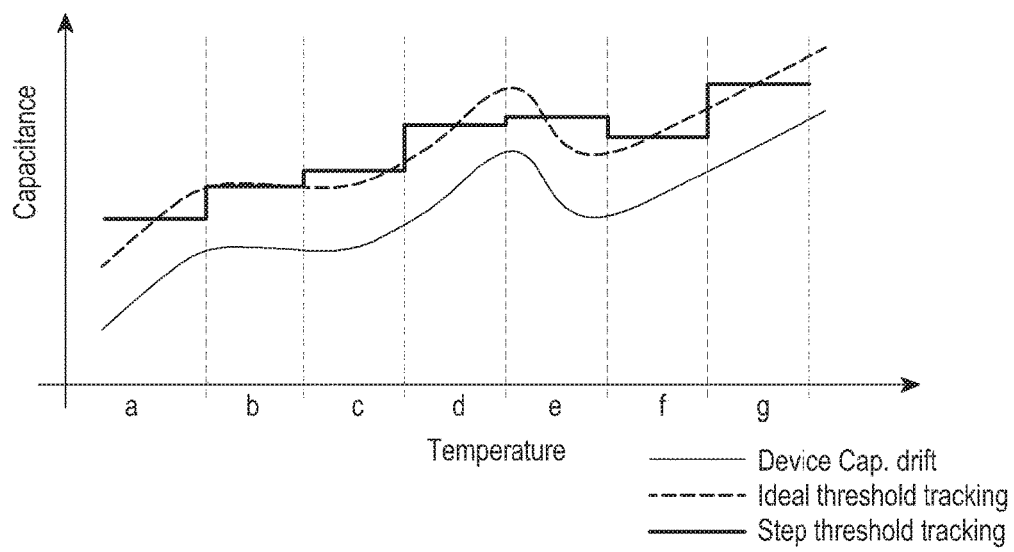
FIGS. 13 and 14 are graphs illustrating an example of setting up a sensing state reference level according to various embodiments of the present disclosure.
Figure 14:
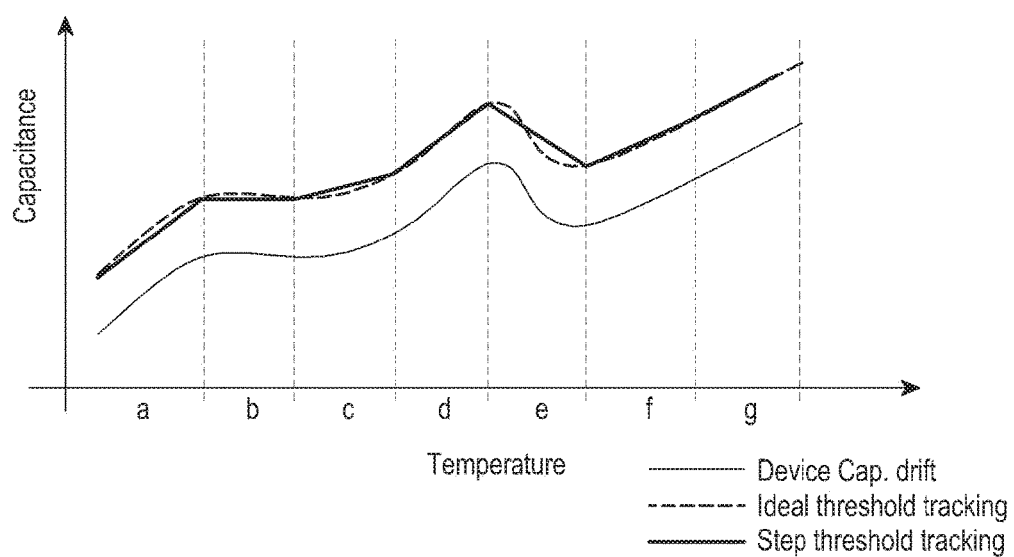

FIGS. 13 and 14 are graphs illustrating an example of setting up a sensing state reference level according to various embodiments of the present disclosure.

Referring to FIG. 13, in a method for setting a sensing state reference level, a sensing state reference level (i.e., ideal threshold tracking) may be set by adding a change in value as the external object contacts or comes in proximity to the electronic device to a signal level (i.e., Device Cap. drift) that may be input to the sensor in a basic state.

According to an embodiment of the present disclosure, a separate sensing state reference level may be set for each of at least one temperature section (a, b, c, d, e, f, and g). For example, a temperature range from −20° C. to 50° C. may be divided into 10° C. temperature sections, and a sensing state reference level may be set corresponding to each temperature section. A predetermined value may be set (i.e., Step threshold tracking) to the sensing state reference level for each temperature section (a, b, c, d, e, f, and g). The sensing state reference level set per temperature section (a, b, c, d, e, f, and g) may be determined by selecting any one of the average value, reference value and mid value of the sensing state reference level in the temperature section.

Referring to FIG. 14, in a method for setting a sensing state reference level, a sensing state reference level (i.e., ideal threshold tracking) may be set by adding a change in value as the external object contacts or comes in proximity to the electronic device to a signal level (i.e., Device Cap. drift) that may be input to the sensor in a basic state.

According to an embodiment of the present disclosure, a separate sensing state reference level may be set for each of at least one temperature section (a, b, c, d, e, f, and g). For example, a temperature range from −20° C. to 50° C. may be divided into 10° C. temperature sections, and a sensing state reference level may be set corresponding to each temperature section. A slope linearly increasing or decreasing per temperature section may be set (i.e., Step threshold tracking) to the sensing state reference level for each temperature section (a, b, c, d, e, f, and g). The sensing state reference level set per temperature section (a, b, c, d, e, f, and g) may be set to a slope linearly connecting the start and end sensing state reference levels in the temperature section.

According to an embodiment of the present disclosure, although it has been described with respect to FIGS. 13 and 14 that the signal level ascends as temperatures goes up, the present disclosure is not limited thereto. For example, as the temperature arises, the signal level may decrease, and in such cases, the sensing state reference level may be set using a change in signal level decreasing as the temperature goes up.

Figure 15:
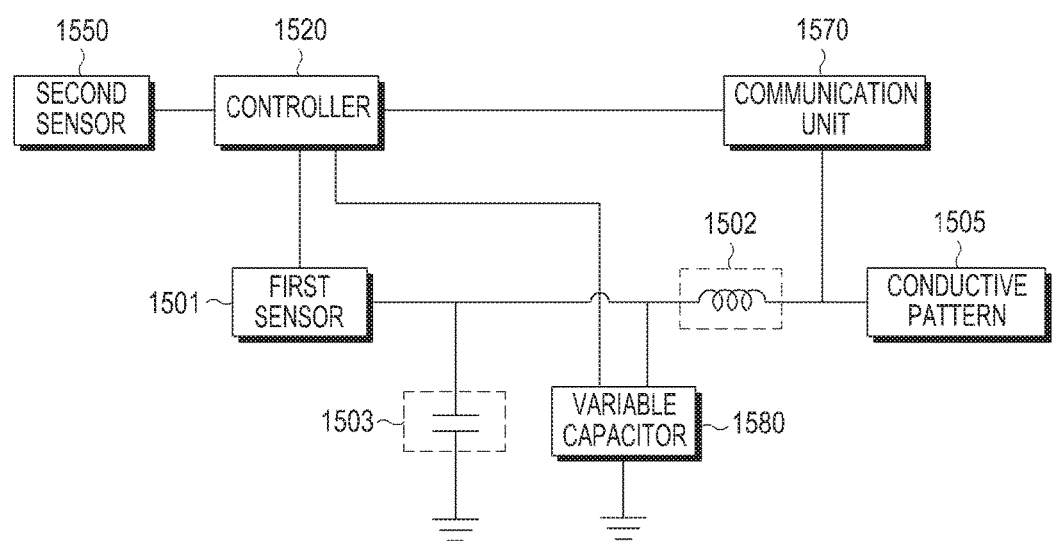
FIG. 15 is a block diagram illustrating a configuration of a grip sensor device according to an embodiment of the present disclosure.

FIG. 15 is a block diagram illustrating a configuration of a grip sensor device according to an embodiment of the present disclosure.

Referring to FIG. 15, according to an embodiment of the present disclosure, a grip sensor device may include a first sensor 1501, a conductive pattern 1505, a controller 1520, a second sensor 1550, a communication unit 1570, and a variable capacitor 1580. According to an embodiment of the present disclosure, the variable capacitor 1580 may include a plurality of capacitors having different capacitances and a switch selectively connecting the plurality of capacitors.

The first sensor 1501 may be a grip sensor module using a capacitive recognition sensing scheme and may be connected with the conductive pattern 1505 to measure a capacitance component generated from the conductive pattern 1505. The first sensor 1501 may sense a change in the capacitance component generated from the conductive pattern 1505, sense a hovering state or contact of the user to the electronic device, and may output a signal for the sensed result.

Here, an LPF 1502 may be further provided between the first sensor 1501 and the conductive pattern 1505 to pass a lower frequency band. The LPF 1502 may allow transfer to the first sensor 1501 of only capacitance components at frequencies lower than a frequency required for the antenna operation when the conductive pattern 1505 functions as an antenna.

A capacitor 1503 may be further provided between the first sensor 1501 and ground to reduce noise and to prevent influx of such noise to the first sensor 1501.

The conductive pattern 1505 may be a conductive material. According to an embodiment of the present disclosure, the conductive pattern 1505 may be disposed in a separate region inside the electronic device. For example, the conductive pattern 1505 may be deposited on a structure of the electronic device or may be equipped in the electronic device in the form of an FPCB. Further, the conductive pattern 1505 may share at least a portion of an antenna pattern.

The second sensor 1550 may measure the temperature of a portion of the electronic device. According to an embodiment of the present disclosure, at least one second sensor 1550 may be disposed at various positions on the electronic device. For example, the second sensor 1550 may be disposed around the first sensor 1501 or the conductive pattern 1505 and apart from heating parts. In doing so, the sensor device may be influenced primarily by the room temperature. Further, the second sensor 1550, rather than measuring the temperature of the inside of the electronic device, may receive external temperature information based on the position of the electronic device, and use the received temperature information. Further, the second sensor 1550 may also use temperature information obtained from a battery gauge of the electronic device or a device measuring the temperature of the battery.

The communication unit 1570 may communicate electromagnetic waves through the antenna to support data communication when the conductive pattern 1505 plays a role as an antenna.

The variable capacitor 1580 may be disposed between the first sensor 1501 and the conductive pattern 1505, and function to vary the capacitance component generated from the conductive pattern 1505. According to an embodiment of the present disclosure, the variable capacitor 1580 may include a switch selectively connecting at least one capacitor to vary capacitance components.

The controller 1520 controls the overall operation of the sensor device and controls the operation of other components (e.g., the first sensor 1501, second sensor 1550, communication unit 1570, and variable capacitor 1580).

The controller 1520 may receive temperature information regarding a portion of the electronic device from the second sensor 1550, correct a sensing level applied to the first sensor 1501 according to the received temperature information, and determine a sensing state of an external object for the electronic device according to a result of a comparison between an output level of the first sensor 1501 by the corrected sensing level and a preset sensing state reference level. For example, the controller 1520 may determine whether the external object is in contact or at least in a hovering state with respect to the electronic device.

According to an embodiment of the present disclosure, the sensing state reference level may be a preset value to determine a sensing state of an external object for the electronic device according to the level of an output signal detected by the first sensor 1505. The sensing state reference level may include at least one reference level to differentiate and determine various sensing states of the external object for the electronic device. For example, the sensing state reference level may include at least one of a reference level corresponding to the state where the external object is not in proximity to the electronic device, a reference level corresponding to the state where the external object is in contact with the electronic device, and a reference level corresponding to the state where the external object is in a hovering state with respect to the electronic device.

The controller 1520 may control the variable capacitor 1580 to vary the capacitance component applied to the first sensor 1501 from the conductive pattern 1505 so that the sensing level applied to the second sensor 1501 may be corrected according to the temperature information regarding the portion of the electronic device which is received from the second sensor 1550.

According to an embodiment of the present disclosure, the controller 1520 may perform the correction by reflecting a preset correction value differentiated for each of at least one temperature section to the capacitance component applied to the first sensor 1501 to thereby correct the output level of the grip sensor 1501. The correction value for correcting the sensing level applied to the first sensor 1501 may be a preset value differentiated for each of at least one temperature section. For example, a temperature range from −20° C. to 50° C. may be divided into 10° C. temperature sections, and a correction value may be set corresponding to each temperature section. As an example, different correction values may be set for the temperature sections, respectively.

Further, the temperature sections may have different intervals, respectively. For example, the intervals of the sections with large value changes may be relatively reduced, while the intervals of the sections with small value changes may be relatively increased.

Figure 16:
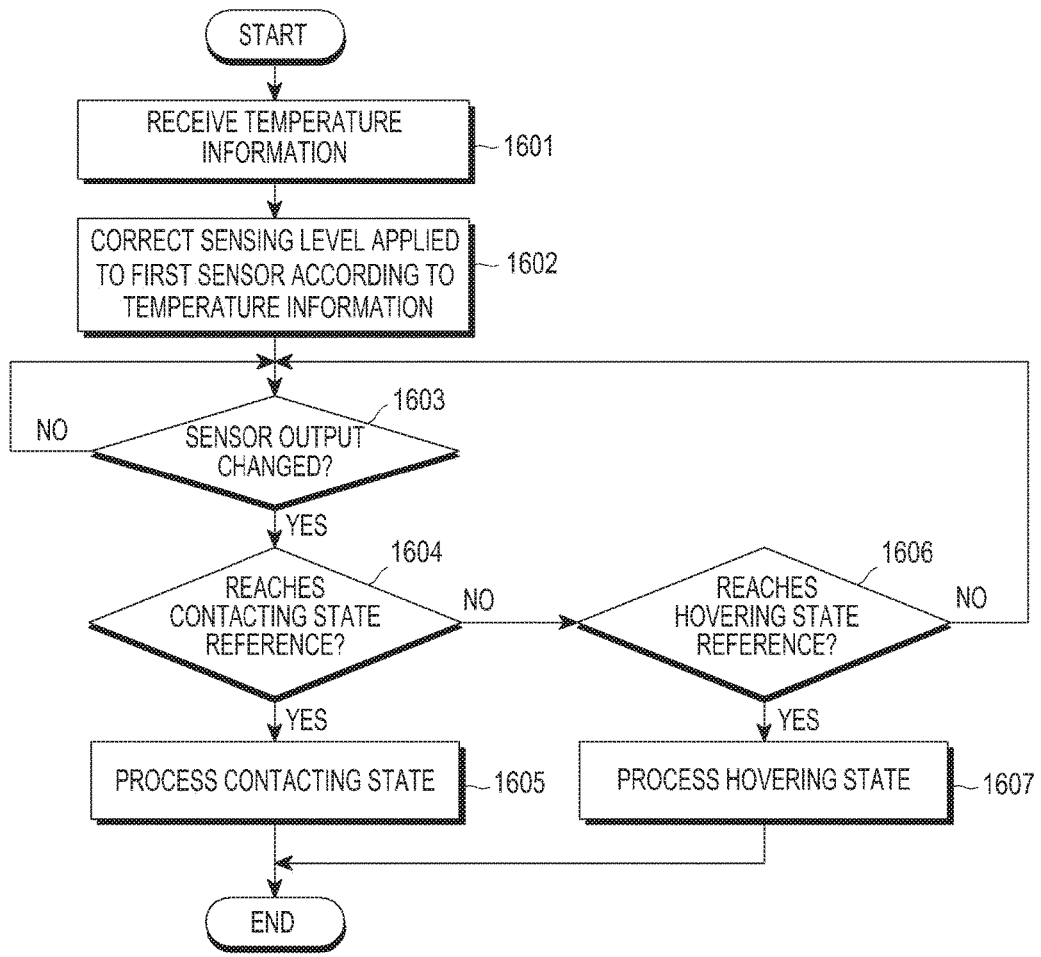
FIG. 16 is a flowchart illustrating a method for determining a sensing state using a grip sensor device according to an embodiment of the present disclosure.

FIG. 16 is a flowchart illustrating a method for determining a sensing state using a grip sensor device according to an embodiment of the present disclosure.

Referring to FIG. 16, an operation for determining a sensing state using a grip sensor device according to an embodiment of the present disclosure is described in greater detail.

In this embodiment of the present disclosure, the operation of determining a sensing state using a grip sensor device has a fixed sensing state reference level and varying sensing levels applied to the sensor, and may resultantly present the same result obtained by the operation of determining a sensing state using a sensor device described above.

In operation 1601, an electronic device 101 may receive temperature information regarding a portion of the electronic device using a temperature sensor. For example, the electronic device 101 may receive the temperature information regarding a surrounding area spaced apart from a heating part or insulated part. Further, rather than receiving the temperature information of the inside of the electronic device 101, an external temperature based on the position of the electronic device 101 may be received, and the received temperature information may be used.

In operation 1602, the electronic device 101 may correct the sensing level applied to the sensor according to the received temperature information. In correcting the sensing level applied to the sensor, the variation may be made with a preset correction value differentiated for each of at least one temperature section reflected to the capacitance component applied to the first sensor 1501, and the same may be detected to correct the output level of the grip sensor.

In operation 1603, the electronic device 101 may repeatedly sense whether the level of a signal output from the sensor changes. For example, the level of the signal output from the sensor by the corrected sensing level may be changed as an external object contacts or hovers over the electronic device.

In operation 1604, the electronic device 101 may identify a preset sensing state reference level when sensing a change in the level of signal output from the sensor and may first determine whether the external object is in contact with the electronic device by comparing the output level of the sensor and the sensing state reference level. In the determination operation, it may be determined whether the level of output from the sensor reaches the sensing state reference level for determining the contacting state that may show relatively the highest sensing state reference level among sensing state reference levels according to various sensing states. When the output level from the sensor reaches the sensing state reference level for the contacting state, the electronic device 101 may determine that the sensing state of the external object for the electronic device is a contacting state in operation 1605.

When it is determined in operation 1604 that the output level of the sensor does not reach the sensing state reference level for the contacting state, the electronic device 101 may determine in operation 1606 whether the level of output from the sensor reaches the sensing state reference level for determining the hovering state that may show relatively the lowest sensing state reference level among sensing state reference levels according to various sensing states. When the output level from the sensor reaches the sensing state reference level for the hovering state, the electronic device 101 may determine that the sensing state of the external object for the electronic device is a hovering state in operation 1607. When the output level from the sensor does not reach the sensing state reference level for the hovering state, the electronic device 101 may return to operation 1603.

Figure 17:
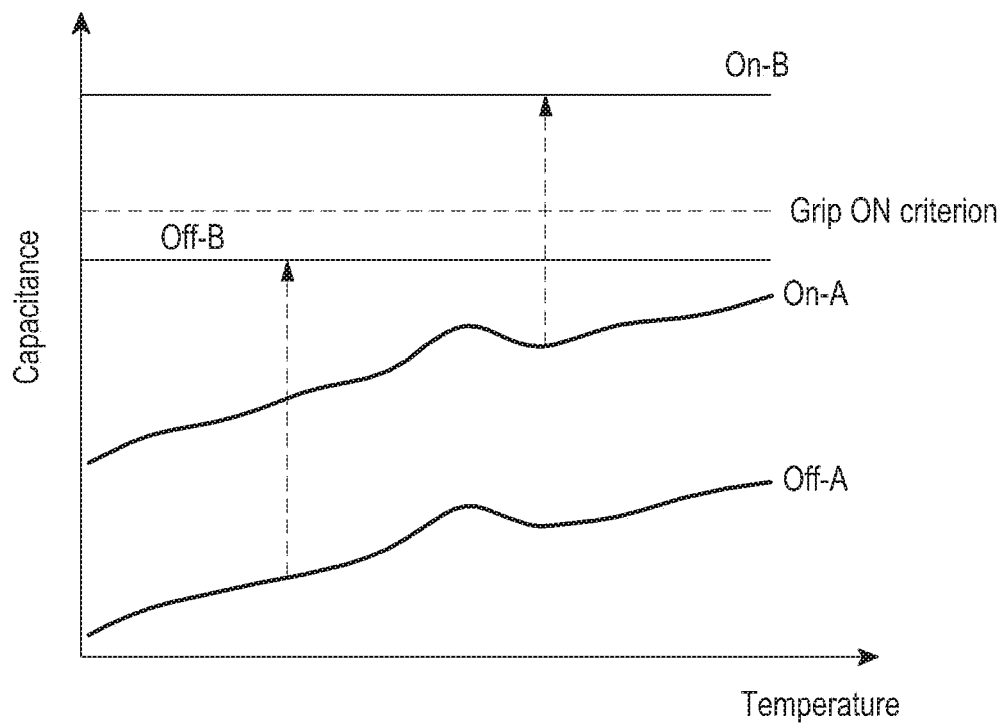
FIG. 17 is a graph illustrating an example of correcting a sensing level applied to a grip sensor according to an embodiment of the present disclosure.

FIG. 17 is a graph illustrating an example of correcting a sensing level applied to a grip sensor according to an embodiment of the present disclosure.

Referring to FIG. 17, in a method for correcting a sensing level applied to a grip sensor according to an embodiment of the present disclosure, a sensing state reference level (i.e., Grip ON criterion) may be fixed against temperature changes, and a sensing level (i.e., On-A) applied to the grip sensor that varies depending on temperature changes may be corrected to have a constant value (i.e. On-B) with respect to the sensing state reference level. For example, the sensing state reference level (i.e., Grip ON criterion) may be set to a temperature at the most normal state, e.g., 15° C., and the sensing level (i.e., On-A) applied to the grip sensor varying depending on temperature changes may accordingly be corrected to be a sensing level (i.e., On-B) that may be presented at a temperature state corresponding to the sensing state reference level. The same operations can be used to determine the sensing levels (i.e., Off-A and Off-B). Further, the reference temperature for correcting the applied sensing level and the sensing state reference level may be set to be different depending on seasons or times.

As is apparent from the forgoing description, according to various embodiments of the present disclosure, a method and apparatus are provided for operating a sensor of an electronic device, and the sensor may be prevented from malfunctioning depending on temperatures, allowing the sensor to stably determine a sensing state.

While the present disclosure has been shown and described with reference to various embodiments thereof, it will be understood by those skilled in the art that various changes in form and detail may be made therein without departing from the spirit and scope of the present disclosure as defined by the appended claims and their equivalents.

What is claimed is:

1. A method for operating an electronic device, the method comprising:
measuring a temperature of a portion of the electronic device;
setting a sensing state reference level of a sensor according to the measured temperature; and
determining a sensing state of an external object for the electronic device according to a result of a comparison between an output level from the sensor and the sensing state reference level of the sensor,
wherein the sensing state of the external object is determined to be either a contacting state or a hovering state based on the result of the comparison between the output level from the sensor and the sensing state reference level of the sensor, the sensing state reference level being based on the measured temperature.

2. The method of claim 1, wherein the measuring of the temperature comprises:
receiving external temperature information based on a position of the electronic device; and
using the received temperature information to measure the temperature.

3. The method of claim 1, wherein the sensing state reference level is a preset value differentiated for each temperature section of a plurality of temperature sections.

4. The method of claim 3, wherein the sensing state reference level is set as a slope linearly increasing or decreasing across each temperature section of the plurality of temperature sections.

5. The method of claim 3, wherein each temperature section of the plurality of temperature sections has a different interval.

6. The method of claim 1, wherein the sensing state reference level includes at least one of a reference level corresponding to a state where the external object is not in proximity to the electronic device, a reference level corresponding to a state where the external object is in contact with the electronic device, or a reference level corresponding to a state where the external object is in a hovering position with respect to the electronic device.

7. An electronic device, the device comprising:
a conductive pattern;
a first sensor configured to sense a capacitive component of the conductive pattern;
a second sensor configured to measure a temperature of a portion of the electronic device; and
at least one processor configured to:
receive temperature information from the second sensor or temperature information based on a position of the electronic device to set a sensing state reference level of the first sensor, and
determine a sensing state of an external object for the electronic device according to a result of a comparison between an output level from the first sensor and the sensing state reference level of the first sensor,
wherein the sensing state of the external object is determined to be either a contacting state or a hovering state based on the result of the comparison between the output level from the sensor and the sensing state reference level of the sensor, the sensing state reference level being based on the temperature information.

8. The electronic device of claim 7,
wherein the second sensor is disposed around the first sensor or the conductive pattern, and
wherein the second sensor is spaced apart from a heating part of the electronic device.

9. The electronic device of claim 7, wherein the conductive pattern includes at least a portion of an antenna pattern.

10. The electronic device of claim 9, further comprising:
a communication unit electrically connected with the antenna pattern, configured to control signal communication through the antenna pattern; and
a low pass filter between the antenna pattern and the first sensor, configured to block transfer of a signal from the communication unit to the first sensor.

* * * * *